United States Patent
Kim et al.

(10) Patent No.: US 7,901,113 B2
(45) Date of Patent: Mar. 8, 2011

(54) SIDE ILLUMINATION LENS AND LUMINESCENT DEVICE USING THE SAME

(75) Inventors: Do-Hyung Kim, Suwon (KR); Chung-Hoon Lee, Gwangmyeong-si (KR); Keon-Young Lee, Ansan (KR); Kwang-Il Park, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 12/730,856

(22) Filed: Mar. 24, 2010

(65) Prior Publication Data

US 2010/0220485 A1  Sep. 2, 2010

Related U.S. Application Data

(63) Continuation of application No. 11/576,882, filed as application No. PCT/KR2005/003346 on Oct. 7, 2005, now Pat. No. 7,748,873.

(30) Foreign Application Priority Data

| Oct. 7, 2004 | (KR) | ............................... 2004-0079909 |
| Jan. 3, 2005 | (KR) | ............................... 2005-0000269 |
| Jun. 28, 2005 | (KR) | ............................... 2005-0056436 |
| Sep. 8, 2005 | (KR) | ............................... 2005-0083743 |

(51) Int. Cl.
  *F21V 5/00* (2006.01)
(52) U.S. Cl. ......... 362/328; 362/308; 362/309; 362/310; 362/326; 362/327; 362/329; 257/98; 257/99; 257/100; 359/362; 359/642; 359/648
(58) Field of Classification Search .................... 362/84, 362/307–310, 326–329, 800; 257/98–100; 359/362, 364–365, 534, 542, 642, 648, 664, 708
See application file for complete search history.

(56) References Cited

U.S. PATENT DOCUMENTS 1,734,834 A  11/1929  Steward et al.
(Continued)

FOREIGN PATENT DOCUMENTS

AT  243828  7/2003
(Continued)

OTHER PUBLICATIONS

Non-Final Office Action dated Aug. 1, 2006 issued in co-pending U.S. Appl. No. 11/178,144.
(Continued)

*Primary Examiner* — Sandra L O Shea
*Assistant Examiner* — Meghan K Dunwiddie
(74) *Attorney, Agent, or Firm* — H.C. Park & Associates, PLC

(57) ABSTRACT

The present invention relates to a side illumination lens and a luminescent device using the same, and provides a body, a total reflection surface with a total reflection slope with respect to a central axis of the body, and a linear and/or curved refractive surface(s) formed to extend from a periphery of the total reflection surface; and a luminescent device including the lens. According to the present invention, a lens with total internal reflection surfaces with different slopes, and a linear and/or curved refractive surface(s) allows light emitted forward from a luminescent chip to be guided to a side of the lens. Further, a linear surface(s) formed in a direction perpendicular or parallel to a central axis of a lens and a curved surface are formed on an edge of the lens so that a process of fabricating the lens is facilitated, thereby reducing a defective rate and fabrication costs of the lens.

11 Claims, 24 Drawing Sheets

U.S. PATENT DOCUMENTS

| | | | |
|---|---|---|---|
| 2,448,244 A | 8/1948 | Arnold | |
| 2,761,056 A | 8/1956 | Lazo | |
| 2,907,869 A | 10/1959 | Vaccaro et al. | |
| 3,223,833 A | 12/1965 | Protzmann | |
| 3,300,646 A | 1/1967 | Casebeer | |
| 3,349,234 A | 10/1967 | Schwarz | |
| 3,539,796 A | 11/1970 | Zychal | |
| 3,586,851 A | 6/1971 | Rudolph | |
| 3,610,941 A | 10/1971 | West | |
| 3,821,590 A | 6/1974 | Kosman et al. | |
| 4,853,593 A | 8/1989 | Stein | |
| 5,177,669 A | 1/1993 | Juskey et al. | |
| 5,958,100 A | 9/1999 | Farnworth et al. | |
| 6,274,924 B1 | 8/2001 | Carey et al. | |
| 6,473,554 B1 | 10/2002 | Pelka et al. | |
| 6,517,218 B2 | 2/2003 | Hochstein | |
| 6,582,103 B1 | 6/2003 | Popovich et al. | |
| 6,598,998 B2 | 7/2003 | West et al. | |
| 6,607,286 B2 | 8/2003 | West et al. | |
| 6,647,199 B1 | 11/2003 | Pelka et al. | |
| 6,679,621 B2 | 1/2004 | West et al. | |
| 6,747,293 B2 | 6/2004 | Nitta et al. | |
| 6,924,514 B2 | 8/2005 | Suenaga | |
| 7,075,114 B2 | 7/2006 | Abe et al. | |
| 7,321,161 B2 | 1/2008 | Teixeira et al. | |
| 2001/0030866 A1 | 10/2001 | Hochstein | |
| 2002/0044454 A1 | 4/2002 | Roller et al. | |
| 2004/0041222 A1 | 3/2004 | Loh | |
| 2004/0126913 A1 | 7/2004 | Loh | |
| 2004/0180459 A1 | 9/2004 | Hsu | |
| 2004/0227149 A1 | 11/2004 | Ibbetson et al. | |
| 2005/0045901 A1 | 3/2005 | Wall, Jr. | |
| 2005/0269587 A1 | 12/2005 | Loh et al. | |
| 2006/0012299 A1 | 1/2006 | Suehiro et al. | |
| 2006/0103012 A1 | 5/2006 | Chin | |

FOREIGN PATENT DOCUMENTS

| | | |
|---|---|---|
| AT | 380971 | 12/2007 |
| AU | 5379998 | 7/1998 |
| AU | 6202600 | 2/2001 |
| CA | 2274828 | 6/1998 |
| CA | 2402037 | 2/2001 |
| CN | 1380704 | 11/2002 |
| DE | 2309586 | 8/1973 |
| DE | 3633203 | 3/1988 |
| DE | 3825436 | 3/1989 |
| DE | 4237107 | 5/1994 |
| DE | 69723101 | 12/2003 |
| DE | 60037427 | 2/2009 |
| EP | 0403764 | 12/1990 |
| EP | 0442529 | 8/1991 |
| EP | 0531939 | 3/1993 |
| EP | 0732679 | 9/1996 |
| EP | 0733850 | 9/1996 |
| EP | 0733928 | 9/1996 |
| EP | 0944800 | 6/2003 |
| EP | 1200772 | 12/2007 |
| GB | 2283849 | 5/1995 |
| JP | S58-173248 | 11/1983 |
| JP | S61-42158 | 2/1986 |
| JP | 63-55503 | 3/1988 |
| JP | 63-206713 | 8/1988 |
| JP | 2-143202 | 6/1990 |
| JP | H03-11771 | 1/1991 |
| JP | 5-46062 | 6/1993 |
| JP | 5-53252 | 7/1993 |
| JP | 6-201996 | 7/1994 |
| JP | 07-111343 | 4/1995 |
| JP | H11-40724 | 2/1999 |
| JP | 11-110790 | 4/1999 |
| JP | 11-121809 | 4/1999 |
| JP | 2000150967 | 5/2000 |
| JP | 2000-174347 | 6/2000 |
| JP | 2001185763 | 7/2001 |
| JP | 2002-512727 | 4/2002 |
| JP | 2002-176203 | 6/2002 |
| JP | 2002252373 | 9/2002 |
| JP | 2003-110146 | 4/2003 |
| JP | 2003-303936 | 10/2003 |
| JP | 2004-221598 | 8/2004 |
| JP | 2004-342791 | 12/2004 |
| JP | 2004-221598 | 8/2007 |
| JP | 4015421 | 9/2007 |
| KR | 1020030024283 | 3/2003 |
| KR | 1020050111298 | 11/2005 |
| KR | 1020060002326 | 1/2006 |
| RU | 2134000 | 7/1999 |
| WO | 92/13232 | 8/1992 |
| WO | 97/30431 | 8/1997 |
| WO | 98/26212 | 6/1998 |
| WO | 99/06759 | 2/1999 |
| WO | 00/55914 | 9/2000 |
| WO | 01/07828 | 2/2001 |
| WO | 2004102685 | 11/2004 |

OTHER PUBLICATIONS

Final Office Action dated Mar. 12, 2007 issued in co-pending U.S. Appl. No. 11/178,144.

Notice of Allowance dated Nov. 29, 2007 issued in co-pending U.S. Appl. No. 11/178,144.

Non-Final Office Action dated Oct. 16, 2008 issued in co-pending U.S. Appl. No. 11/575,128.

Non-Final Office Action dated Jul. 24, 2009 issued in co-pending U.S. Appl. No. 11/575,128.

Final Office Action dated Dec. 29, 2009 issued in co-pending U.S. Appl. No. 11/575,128.

Non-Final Office Action dated Jun. 2, 2009 issued in co-pending U.S. Appl. No. 12/196,028.

Non-Final Rejection issued Jun. 1, 2009 in co-pending U.S. Appl. No. 11/576,882.

[Fig. 1]
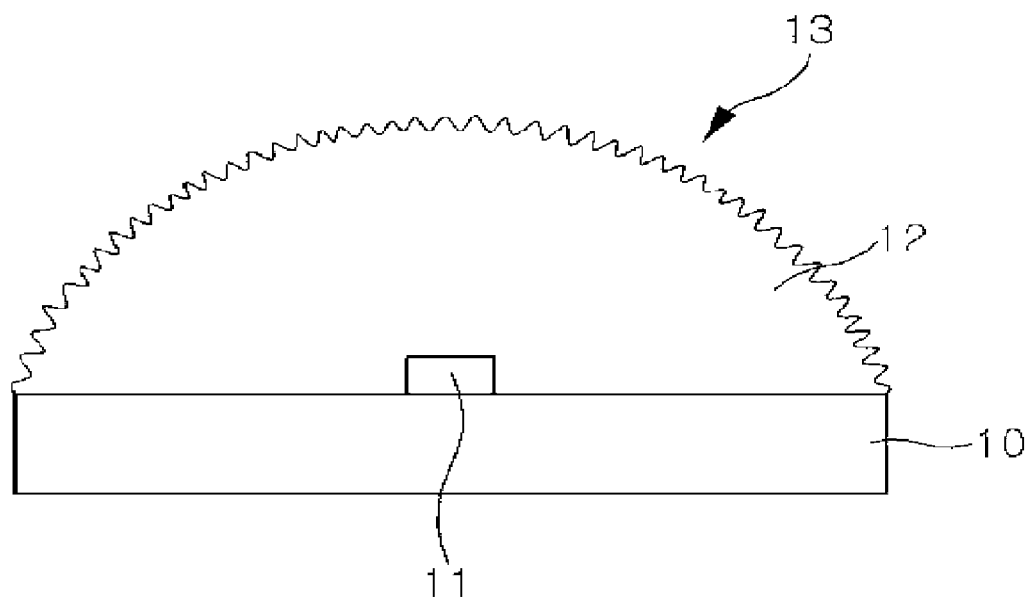
[Fig. 2]
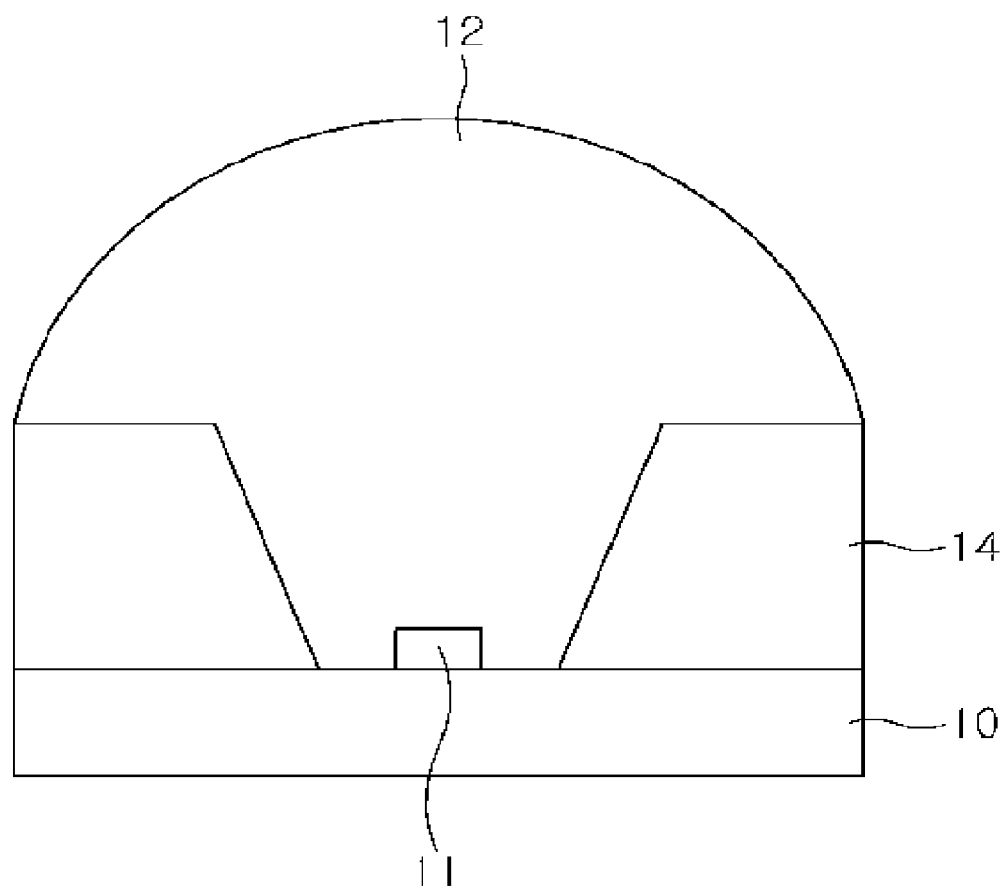

[Fig. 3]
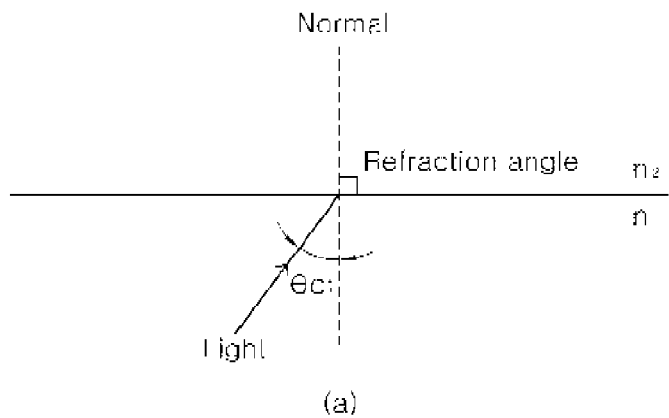
(a)
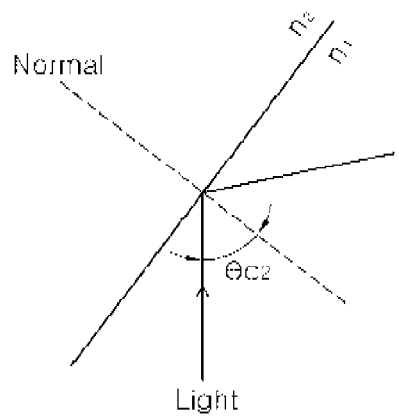
(b)
[Fig. 4]
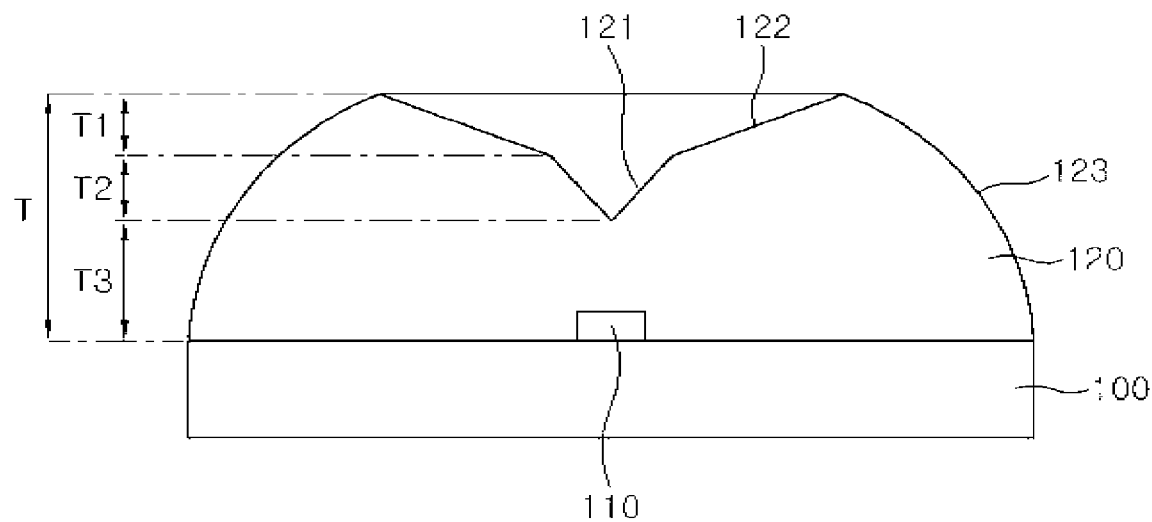

[Fig. 5]
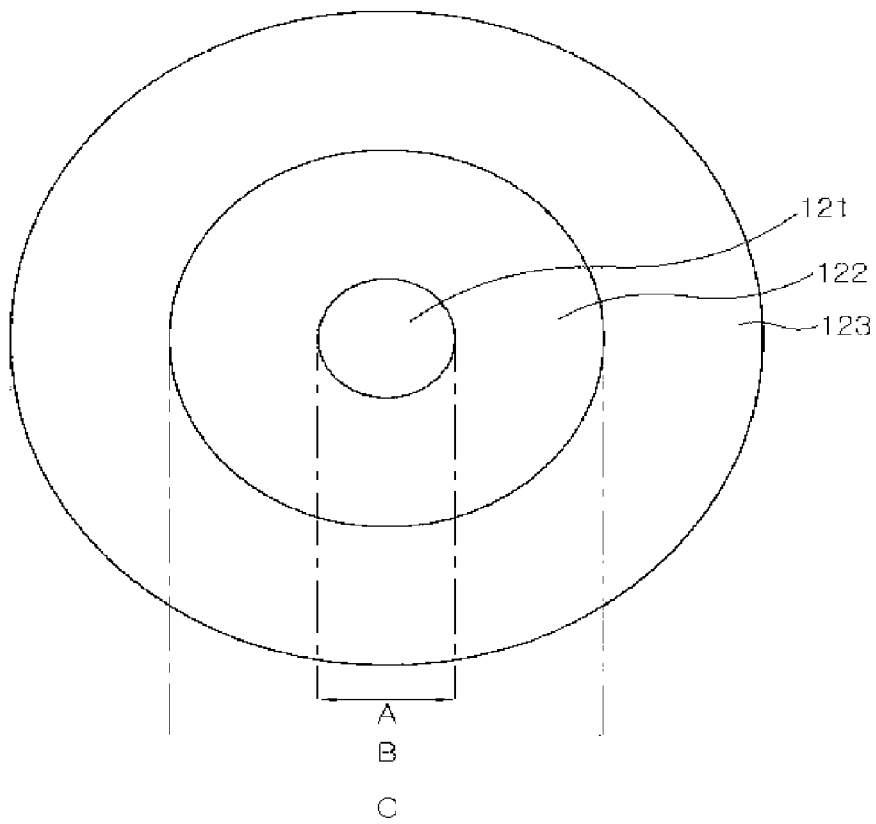
[Fig. 6]
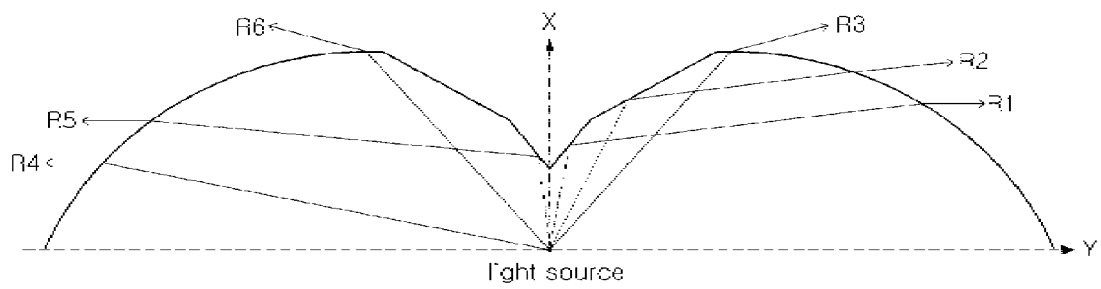

[Fig. 7]
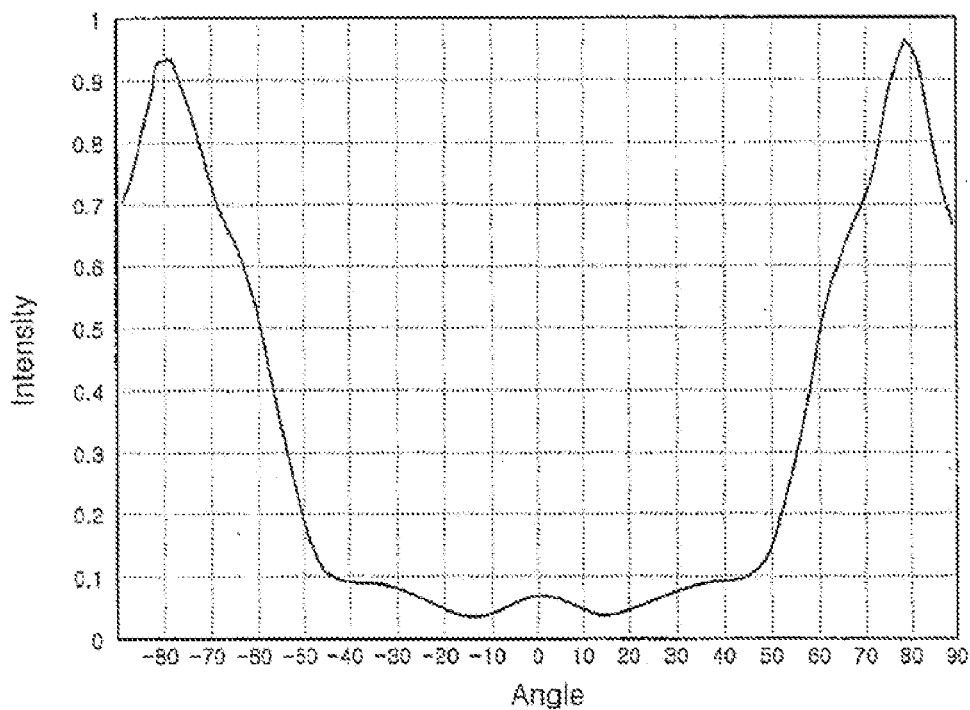
[Fig. 8]
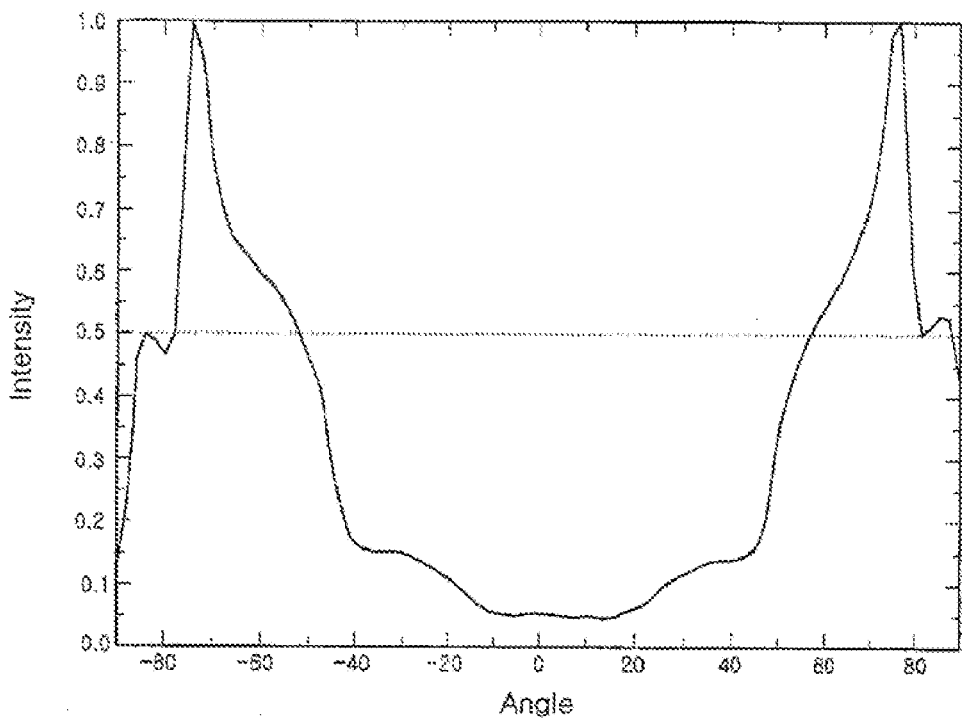

[Fig. 9]
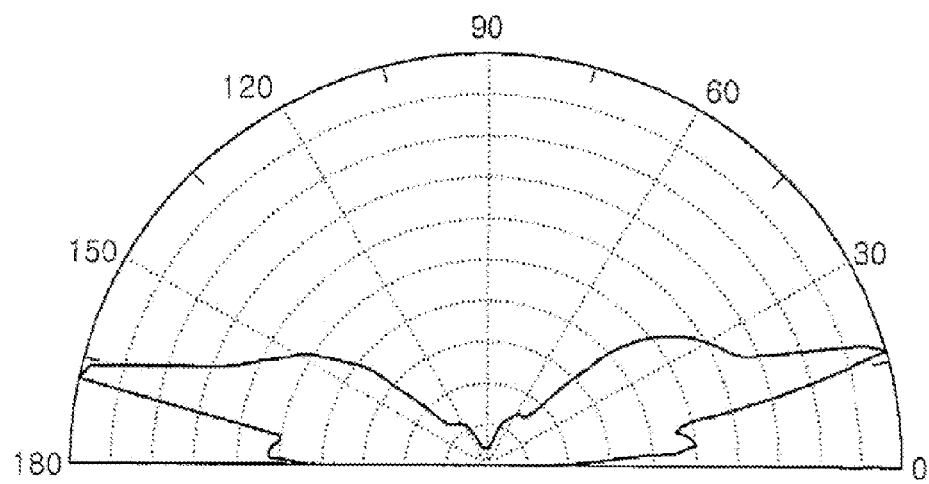
[Fig. 10]
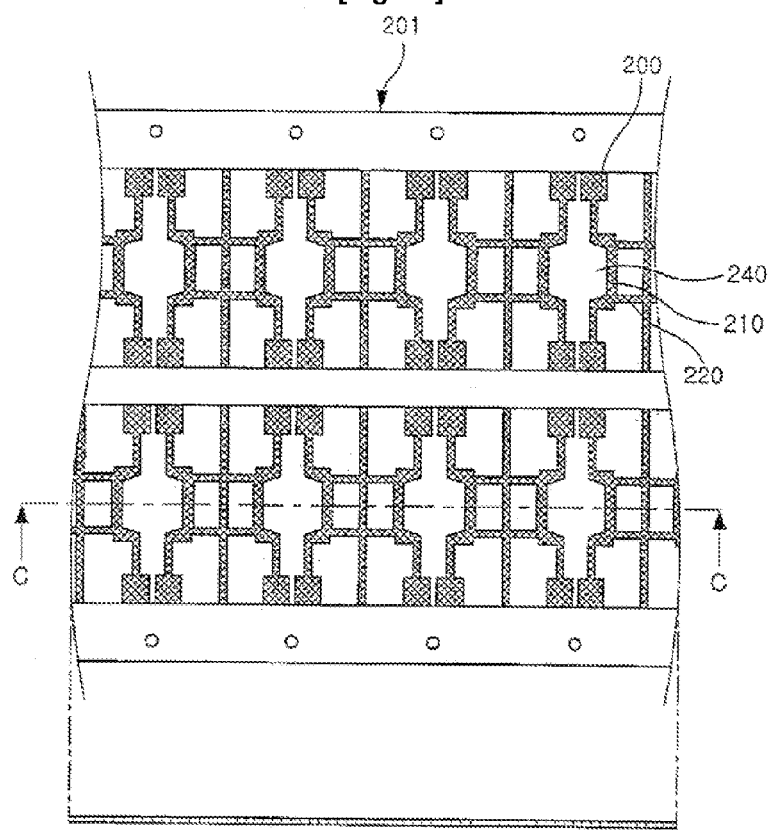

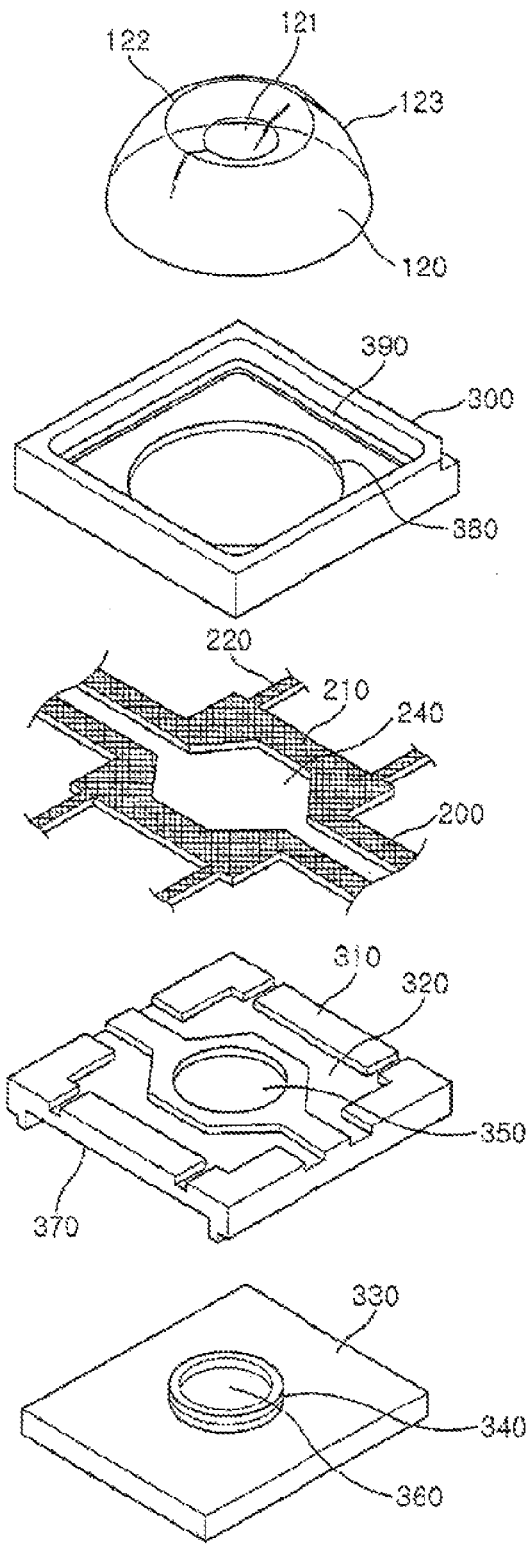
[Fig. 11]

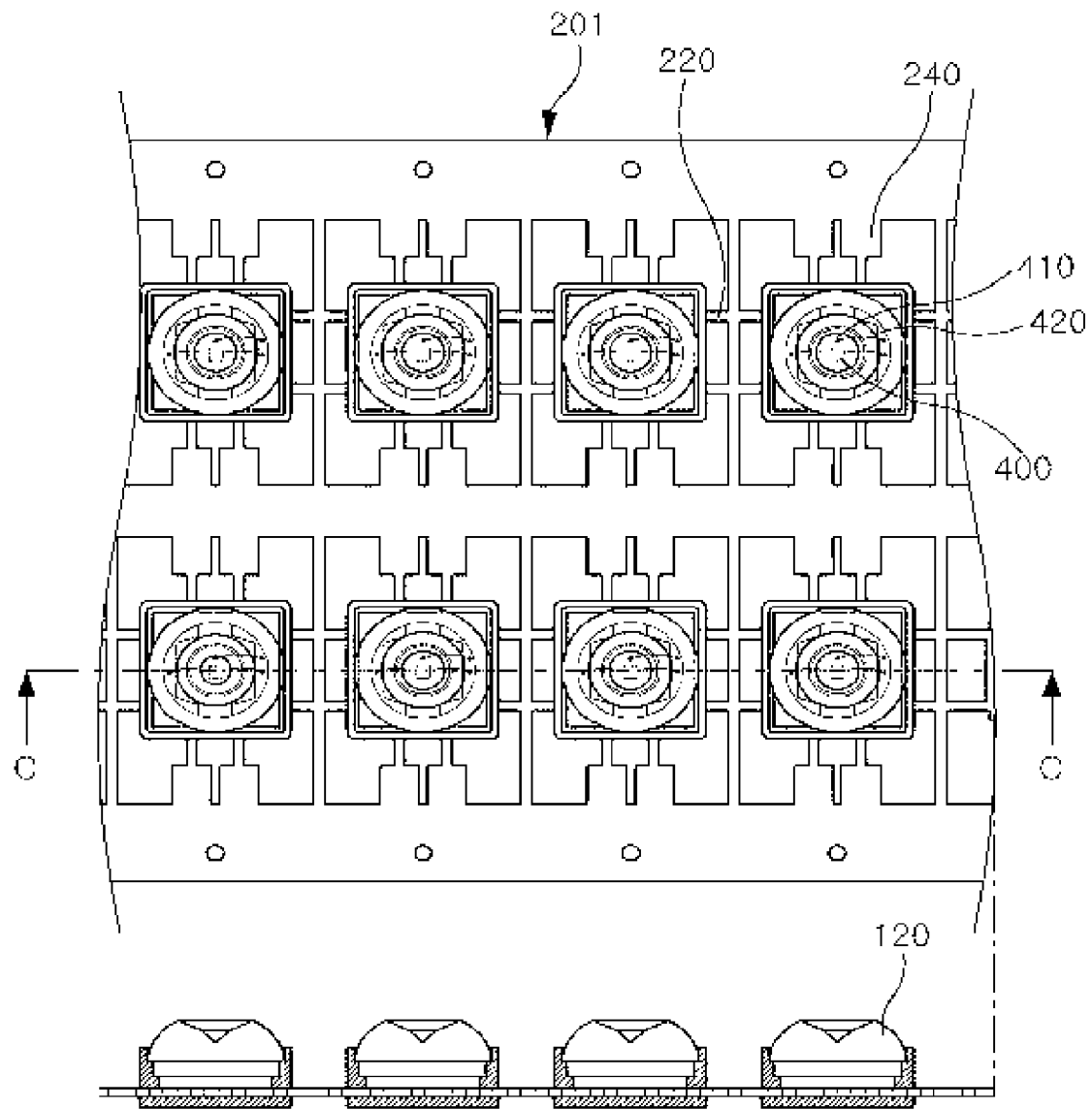

[Fig. 13]
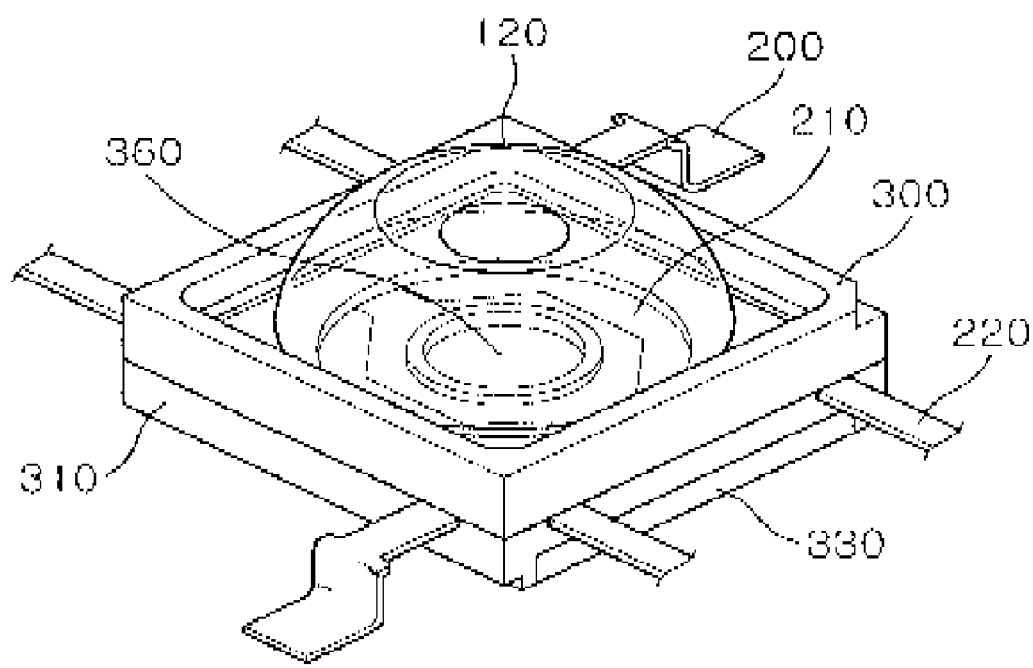
(a)
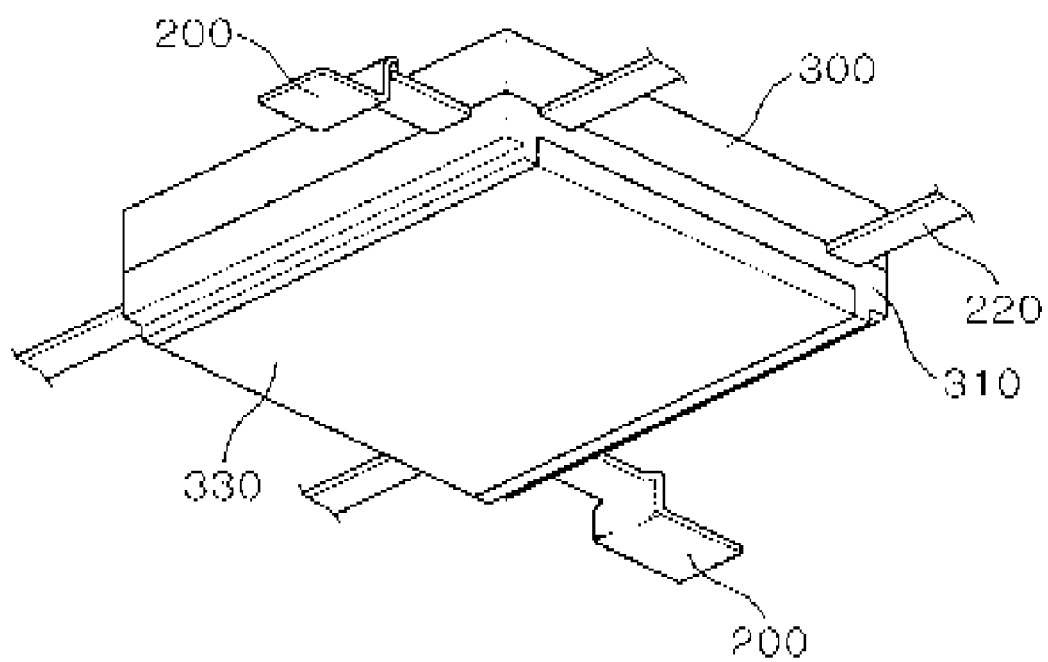
(b)

[Fig. 14]
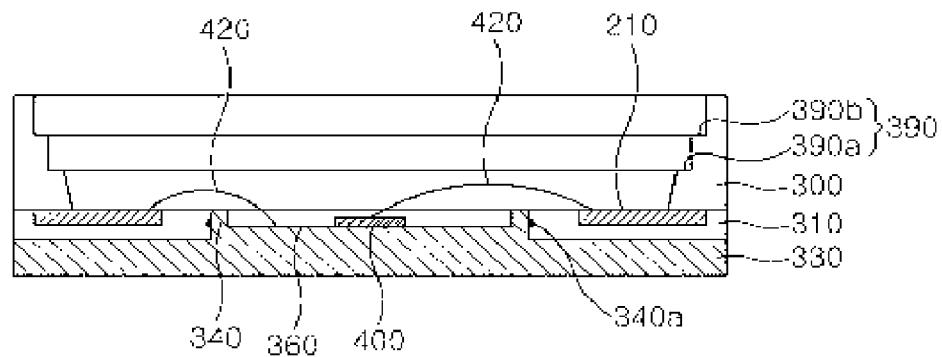
(a)
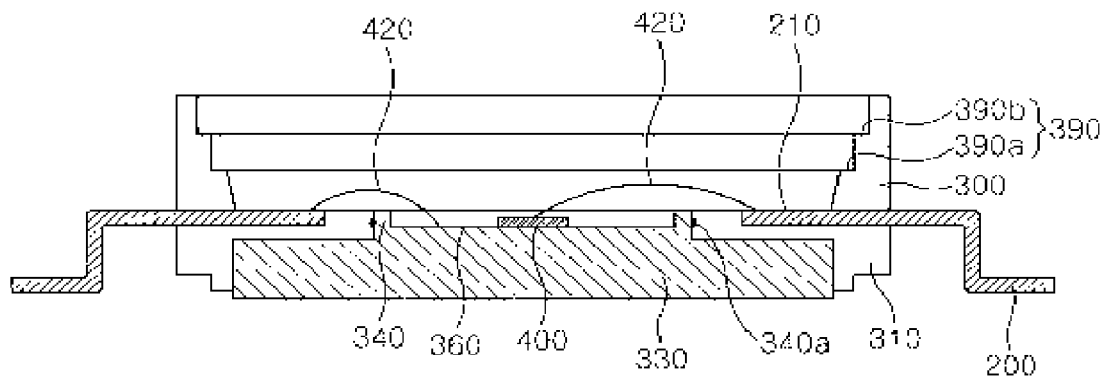
(b)

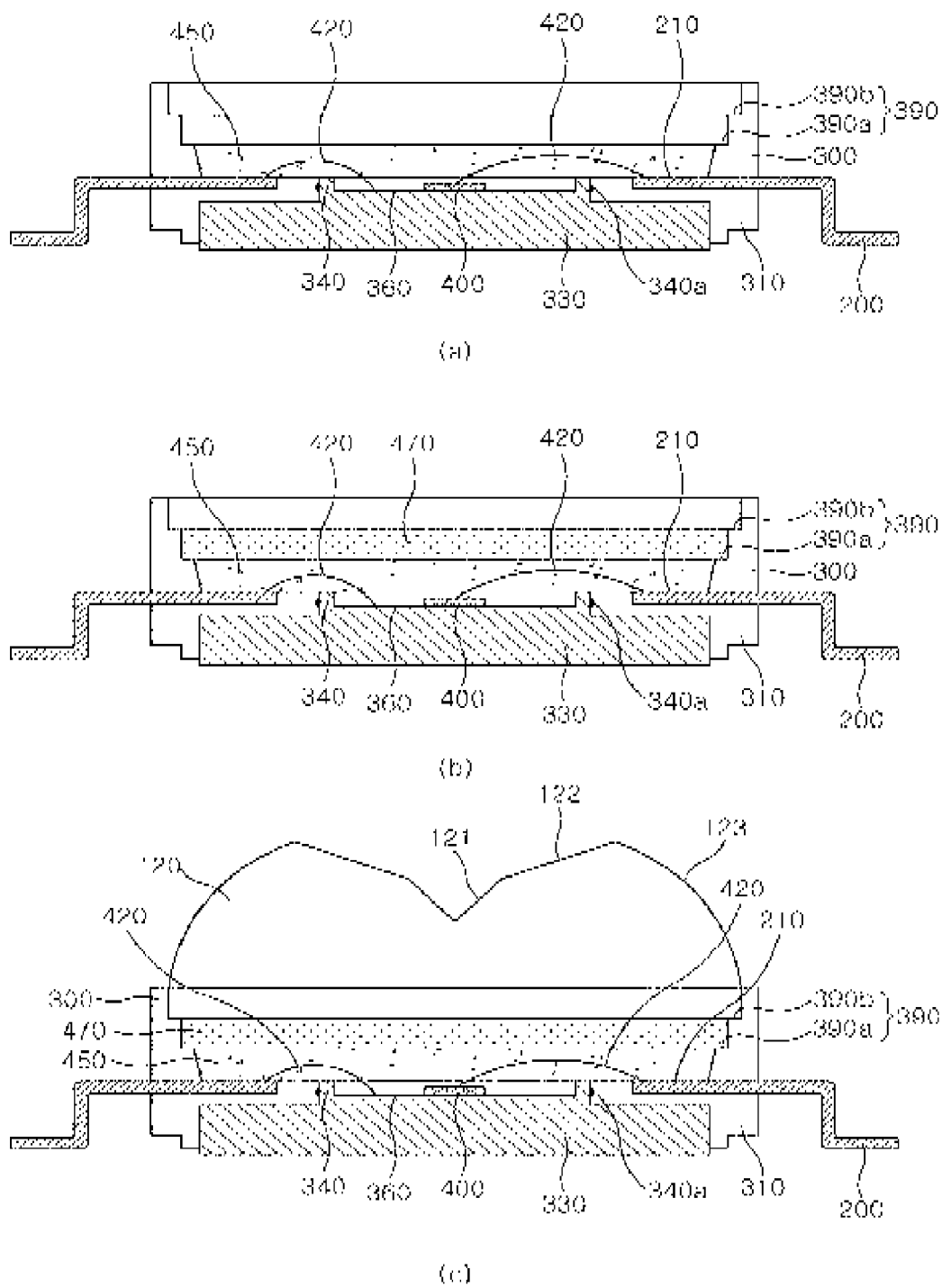
[Fig. 15]

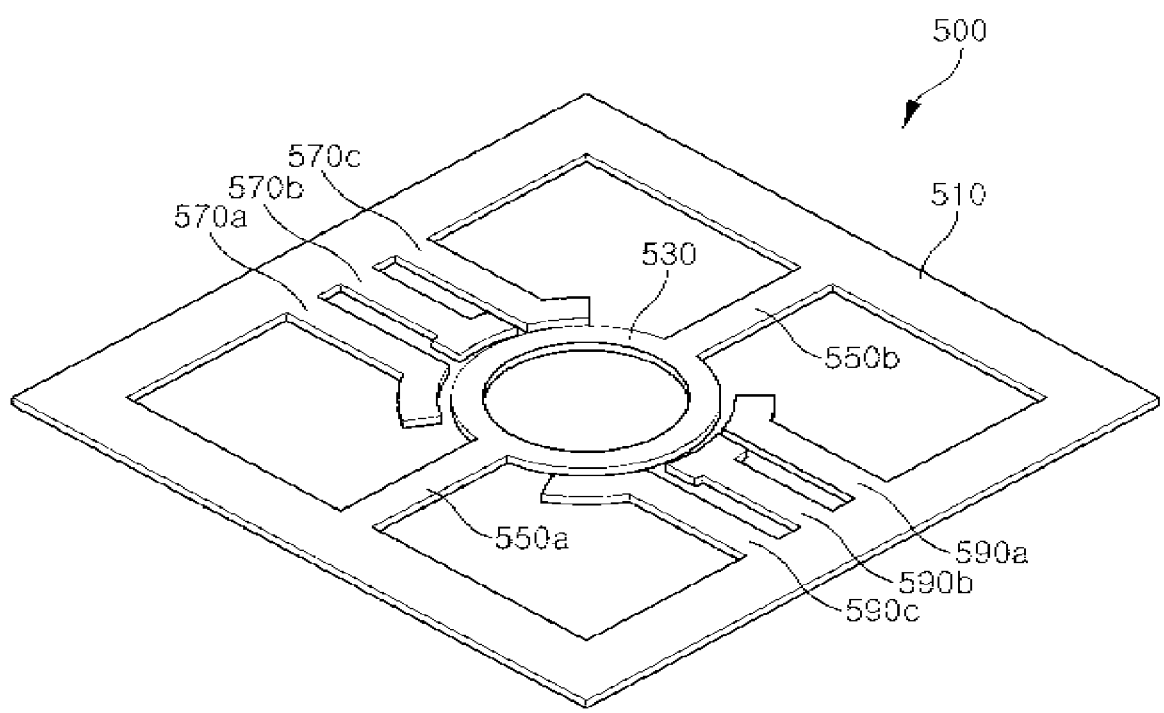
[Fig. 16]

[Fig. 17]
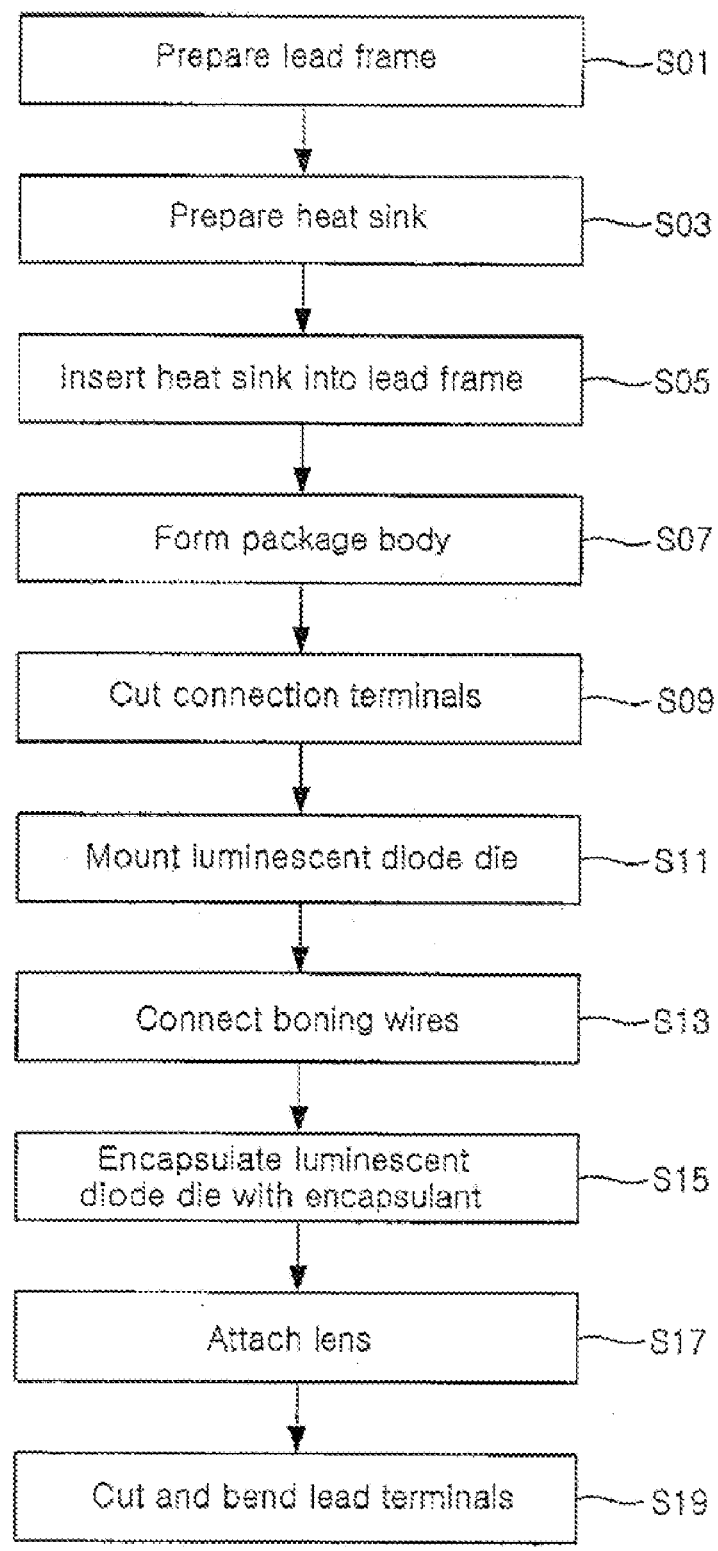

[Fig. 18]
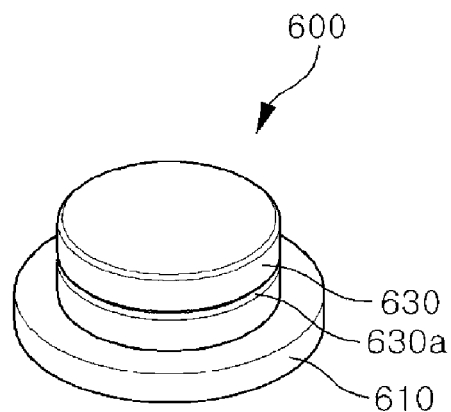
[Fig. 19]
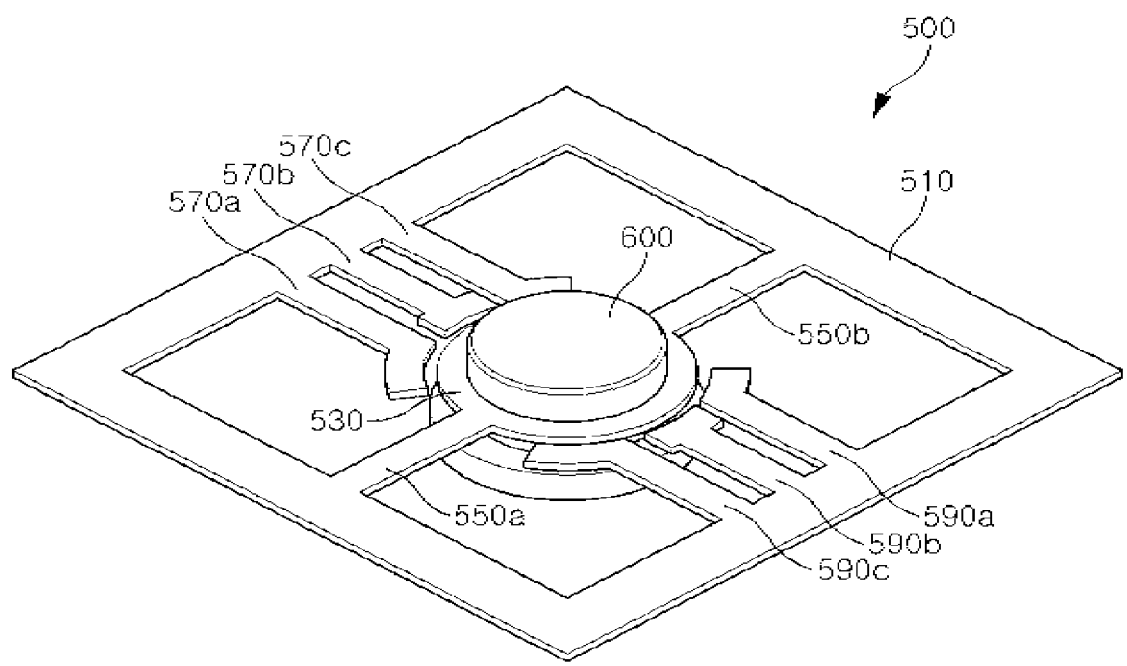

[Fig. 20]
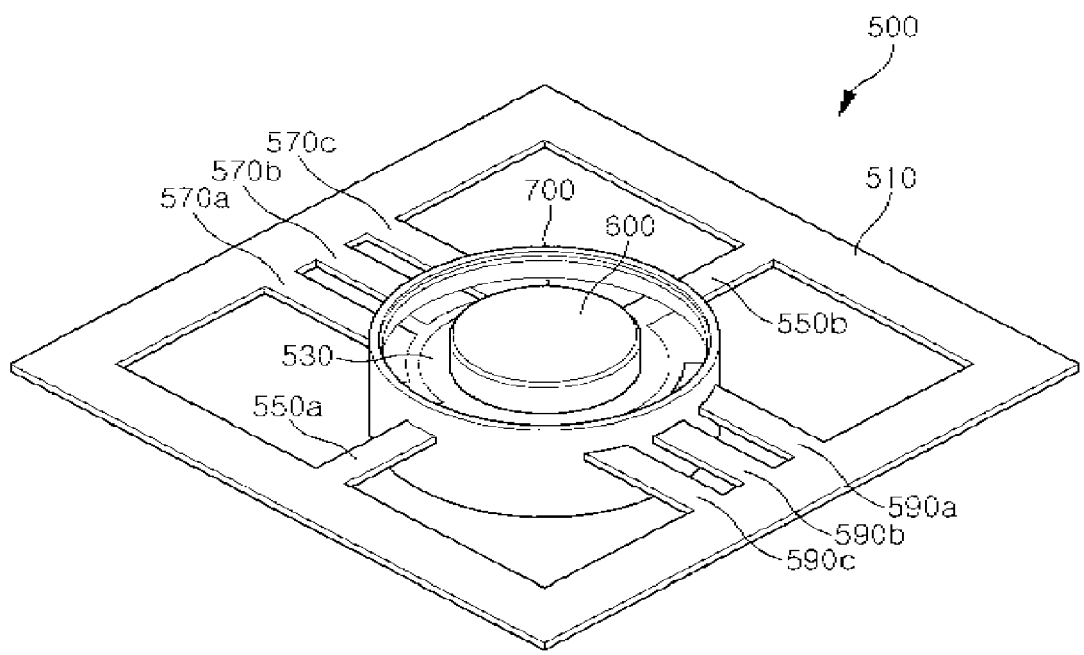
[Fig. 21]
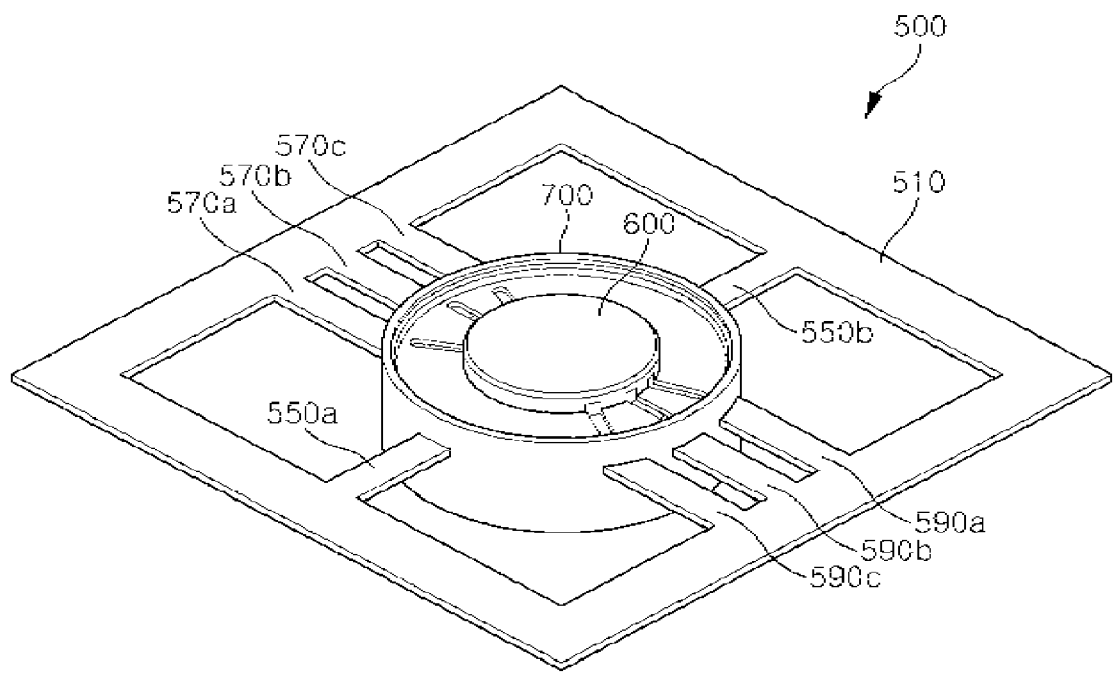

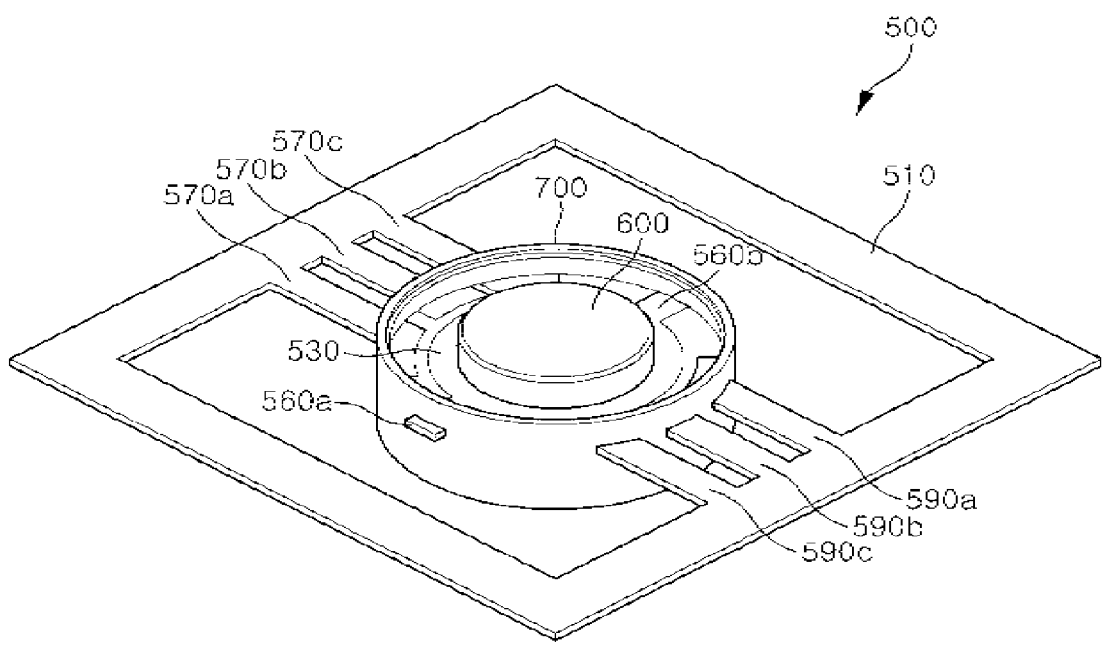
[Fig. 22]
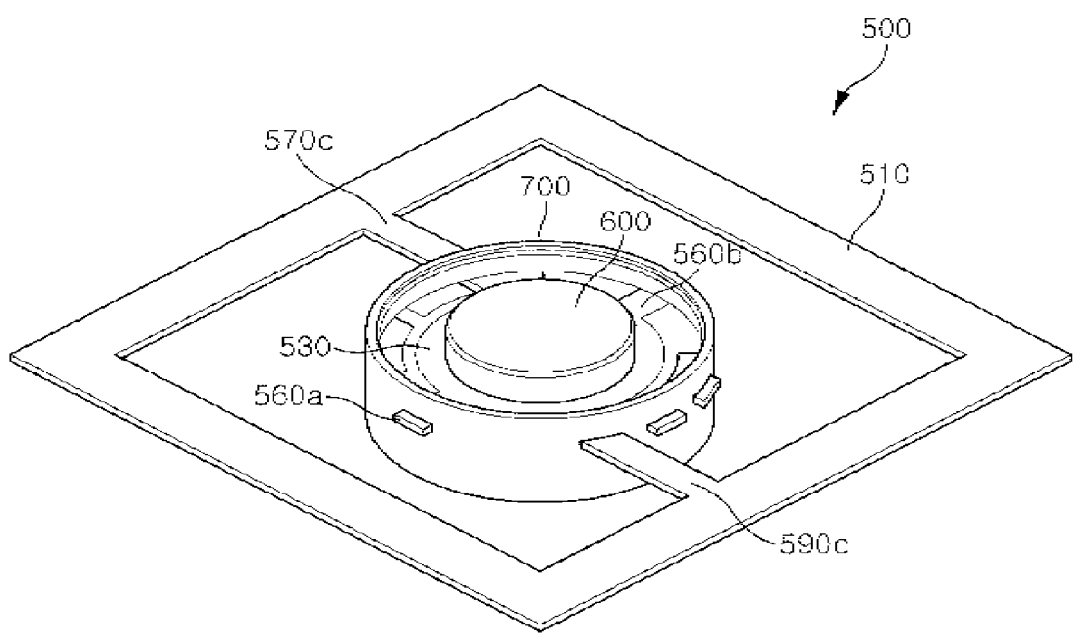
[Fig. 23]

[Fig. 24]
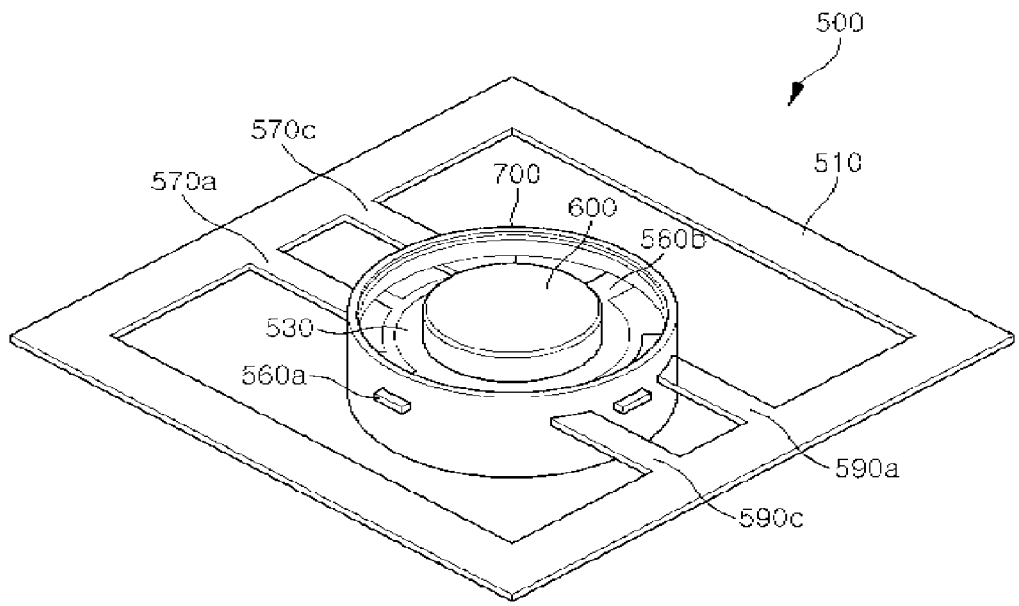
[Fig. 25]
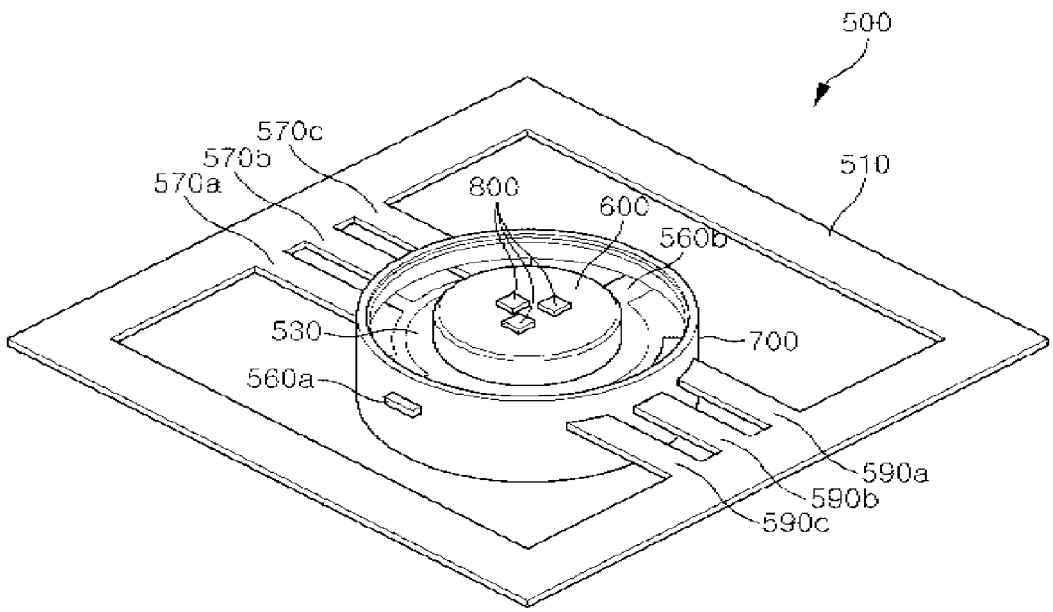

[Fig. 26]
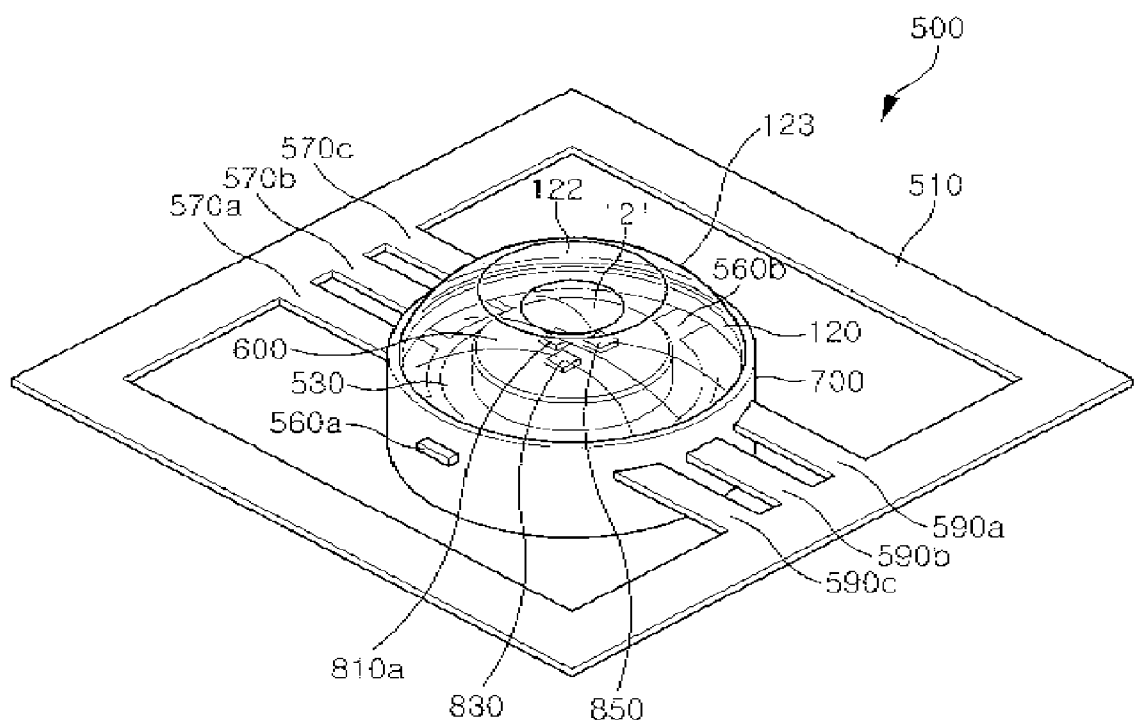
[Fig. 27]
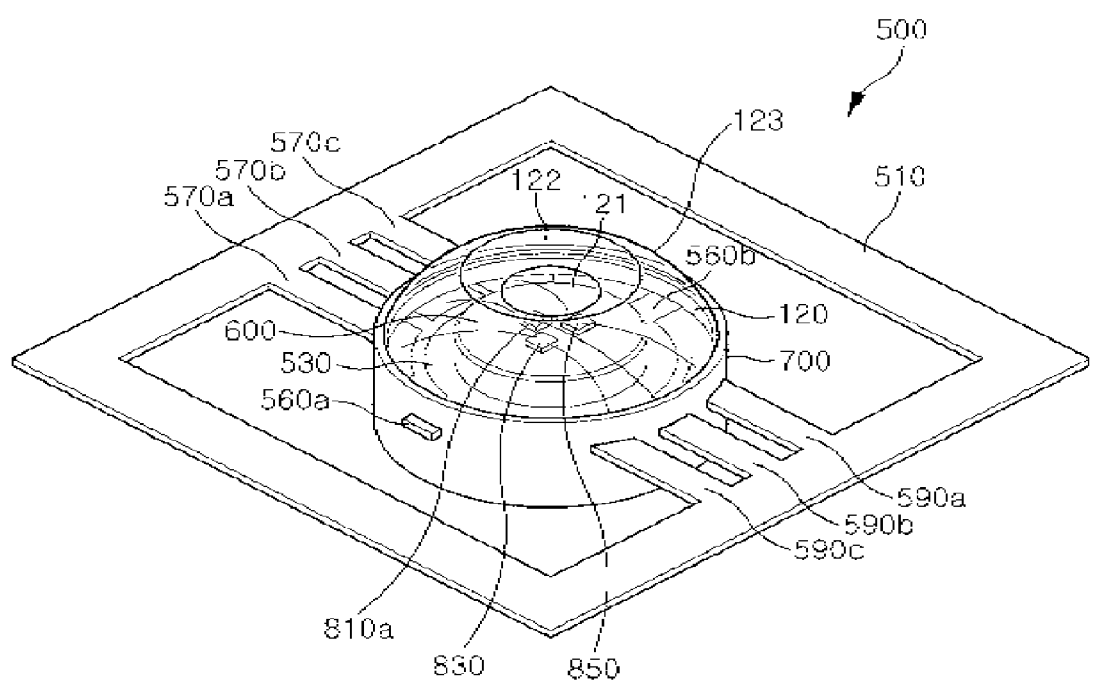

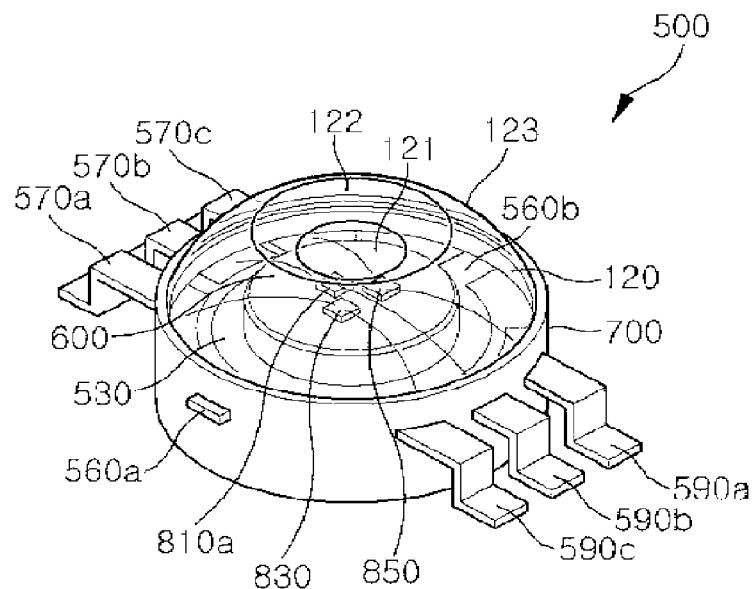
[Fig. 28]
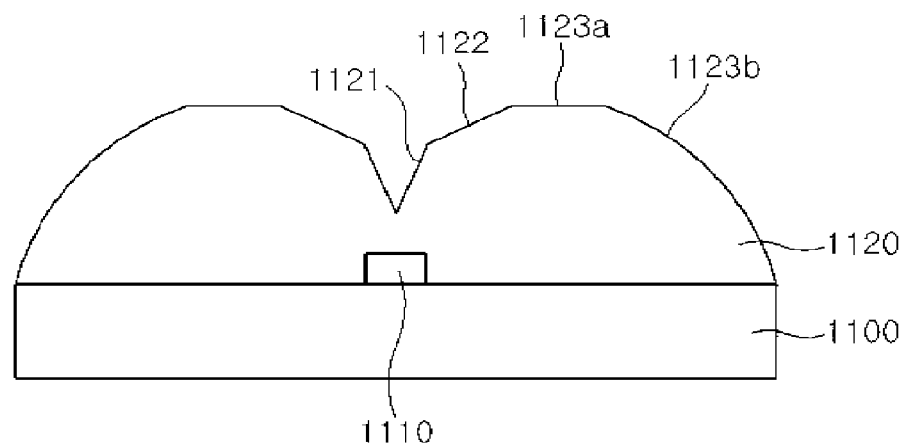
[Fig. 29]
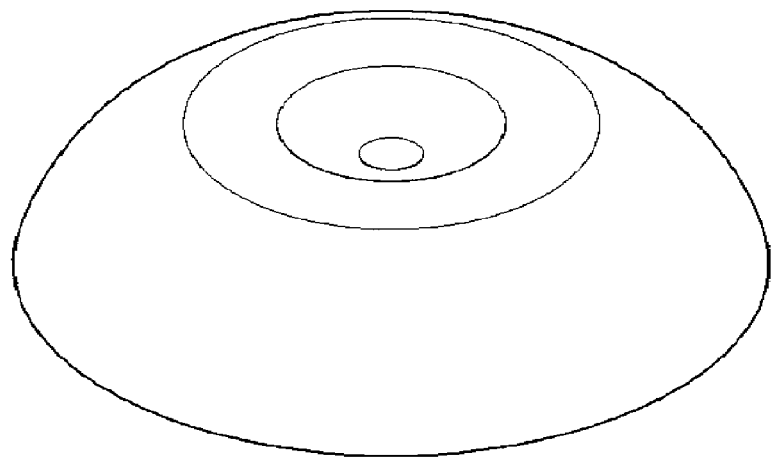
[Fig. 30]

[Fig. 31]
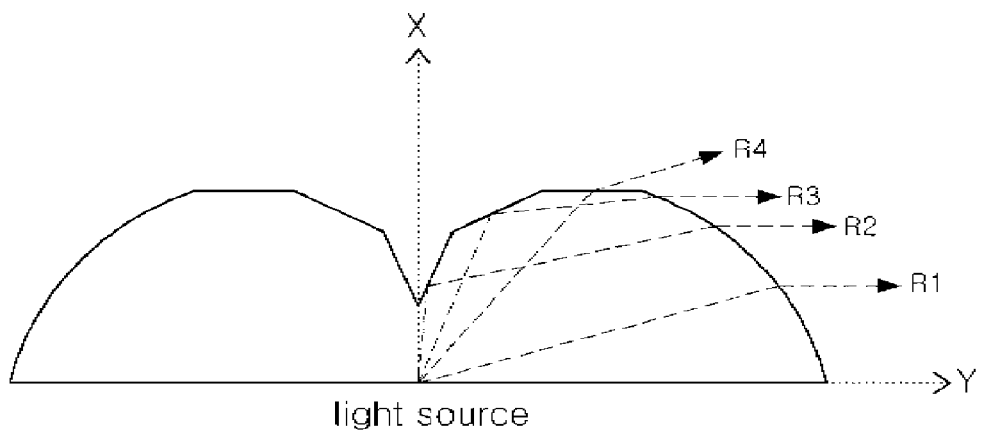
[Fig. 32]
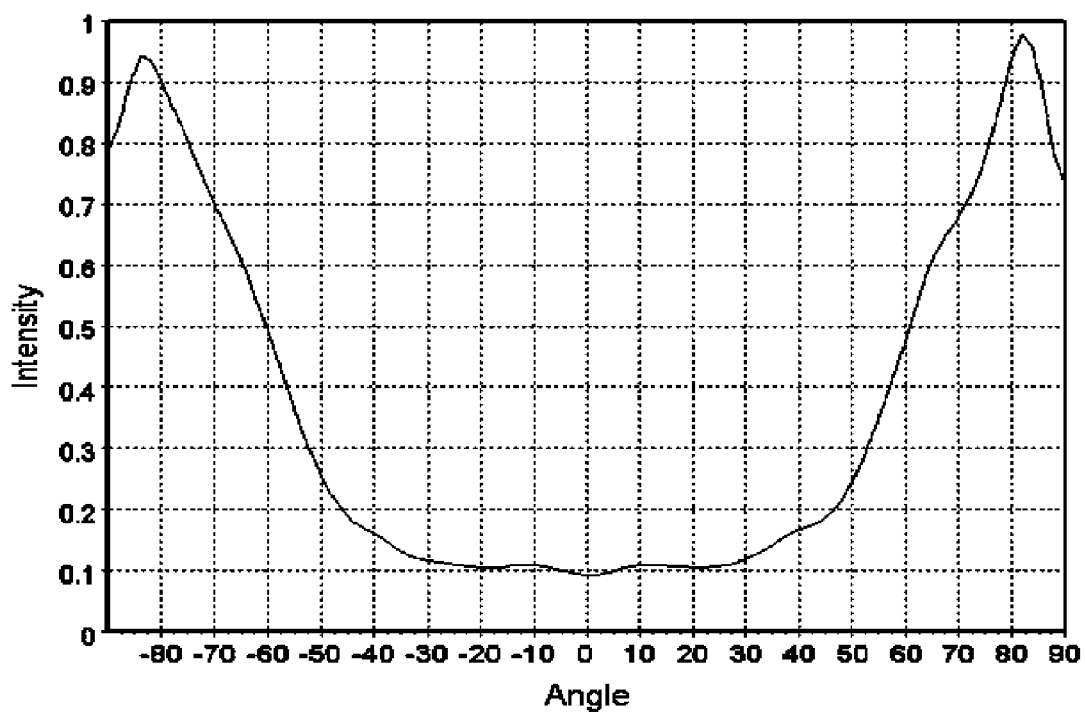

[Fig. 33]
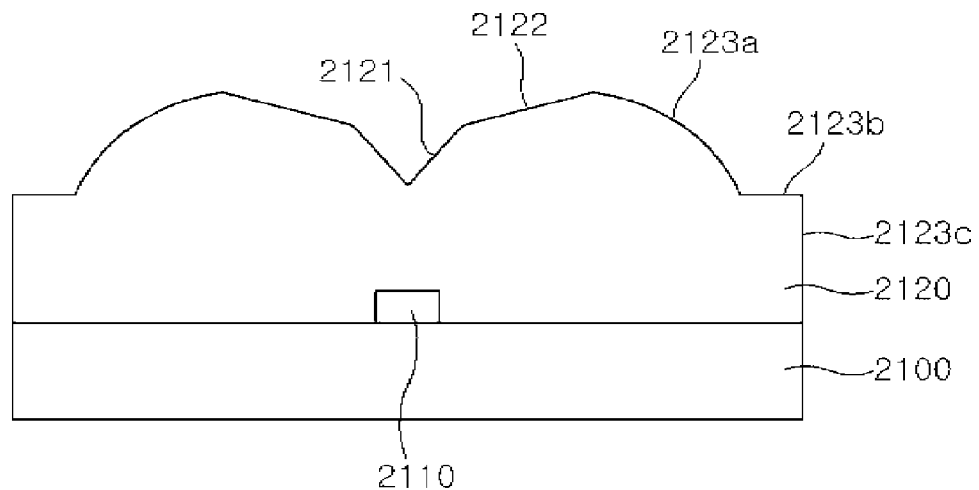
[Fig. 34]
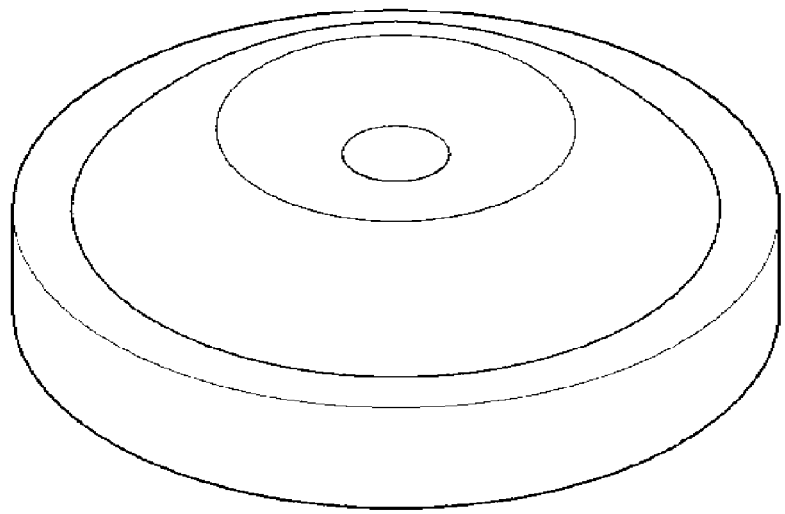
[Fig. 35]
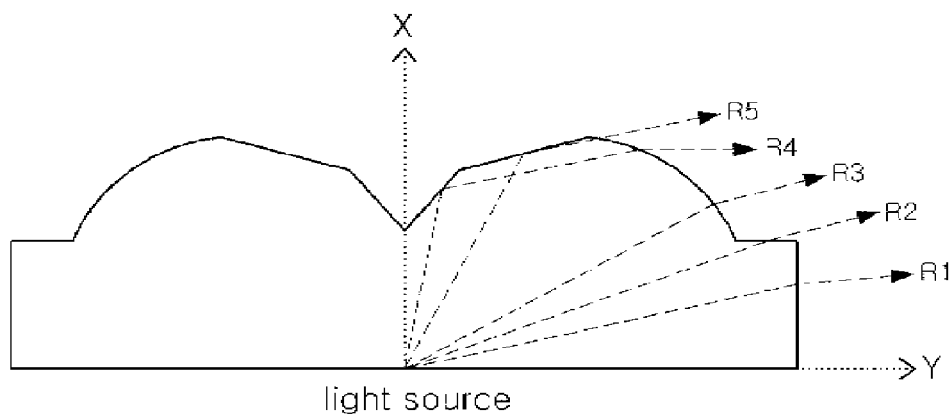

[Fig. 36]
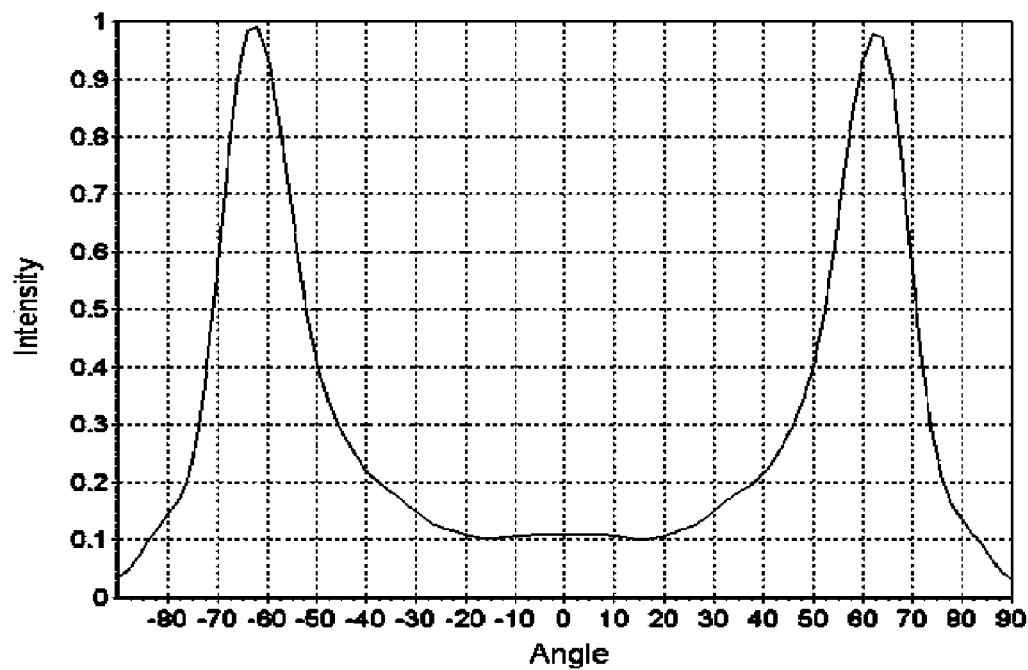
[Fig. 37]
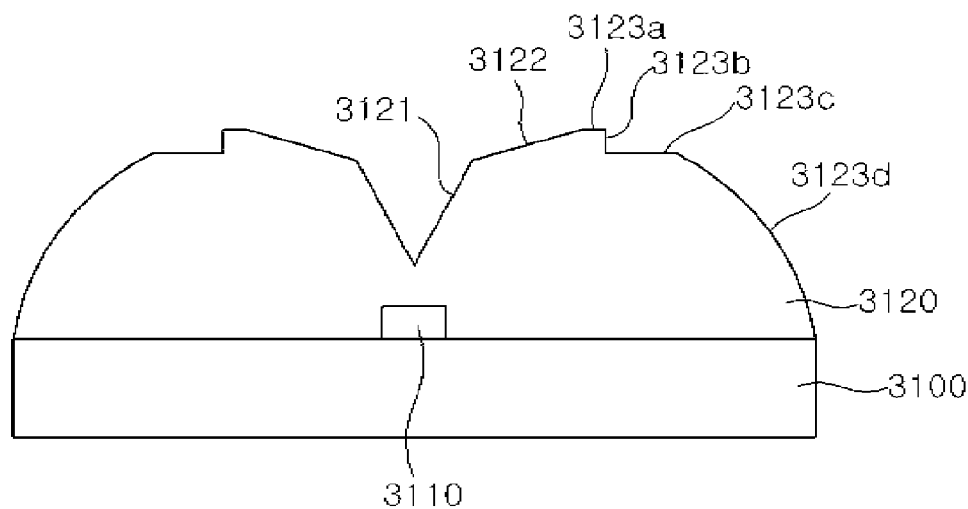

[Fig. 38]
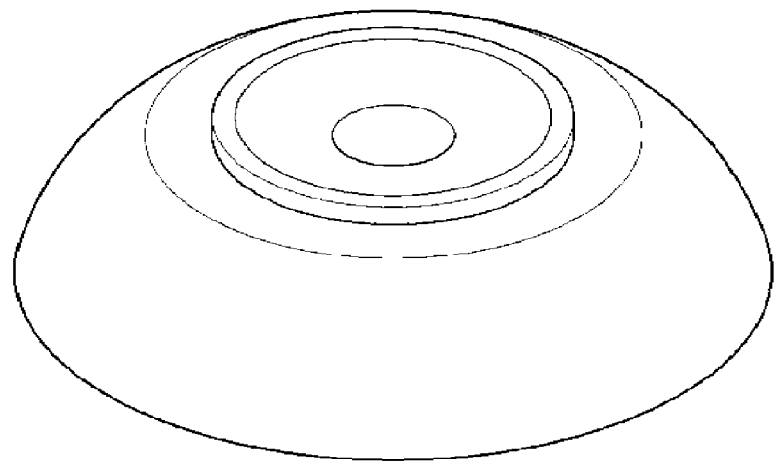
[Fig. 39]
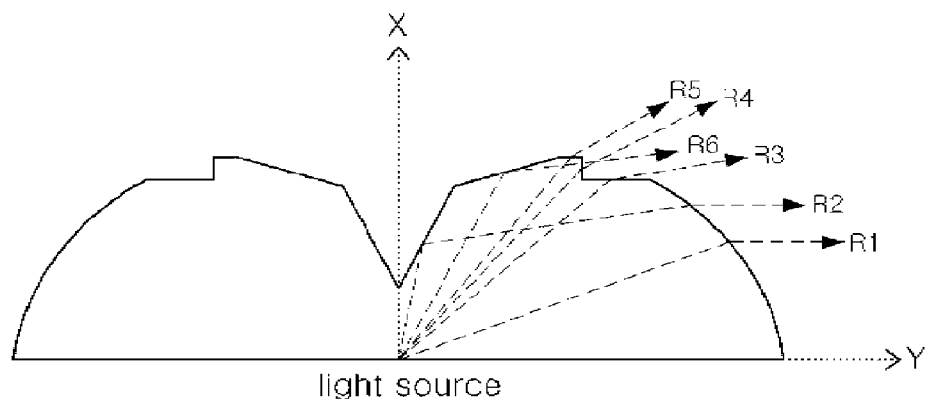
[Fig. 40]
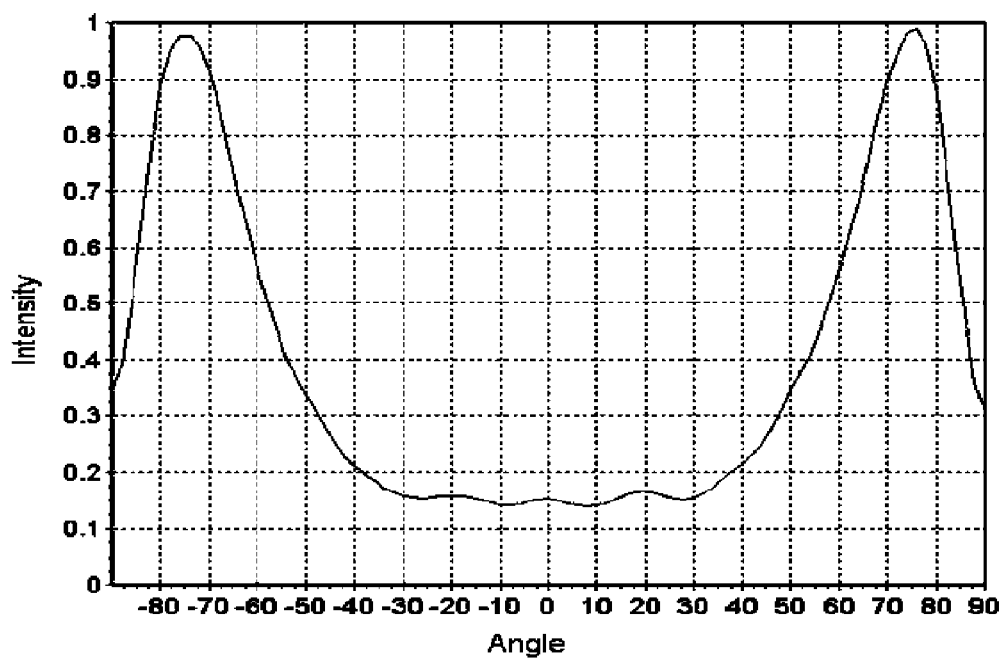

[Fig. 41]
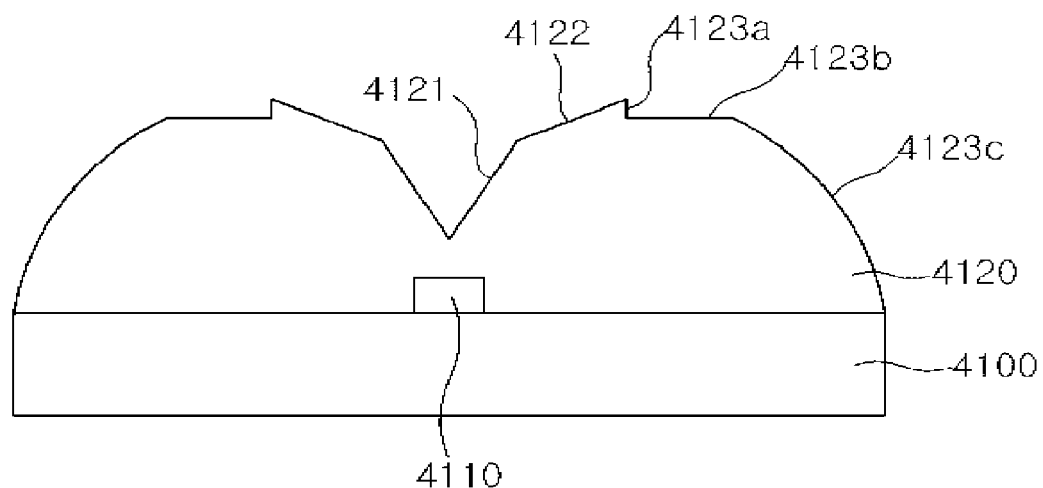
[Fig. 42]
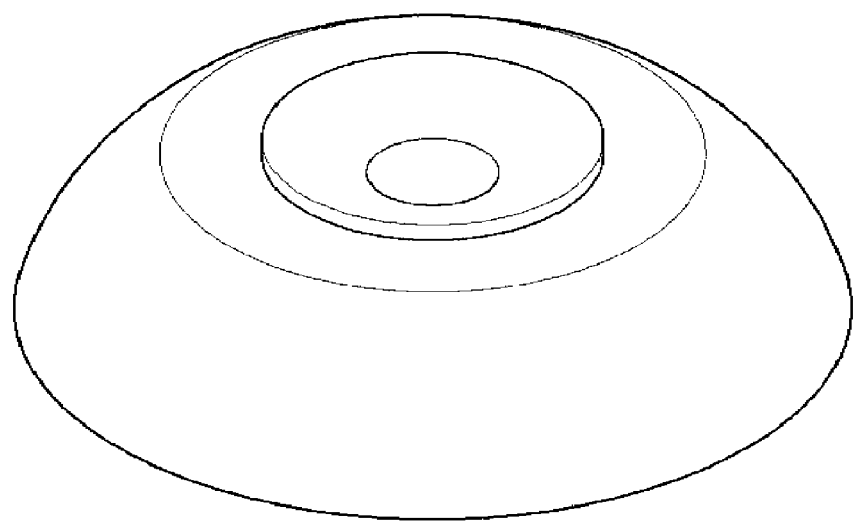
[Fig. 43]
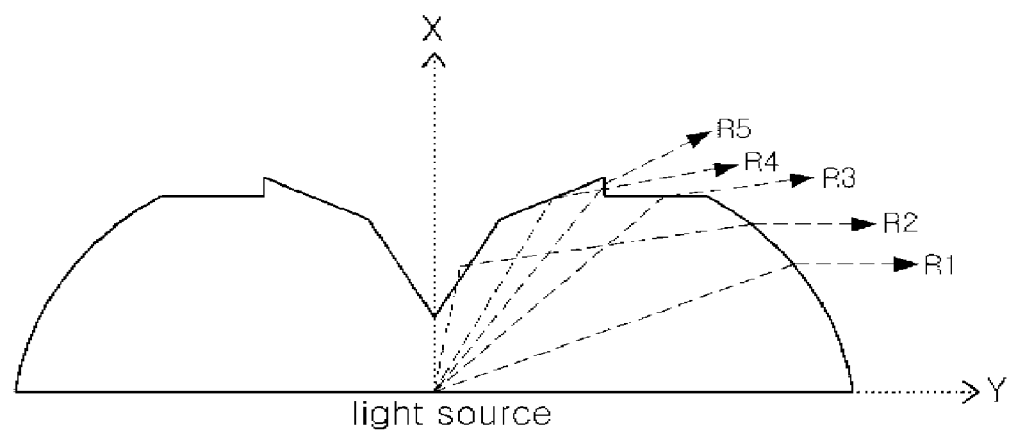

[Fig. 44]
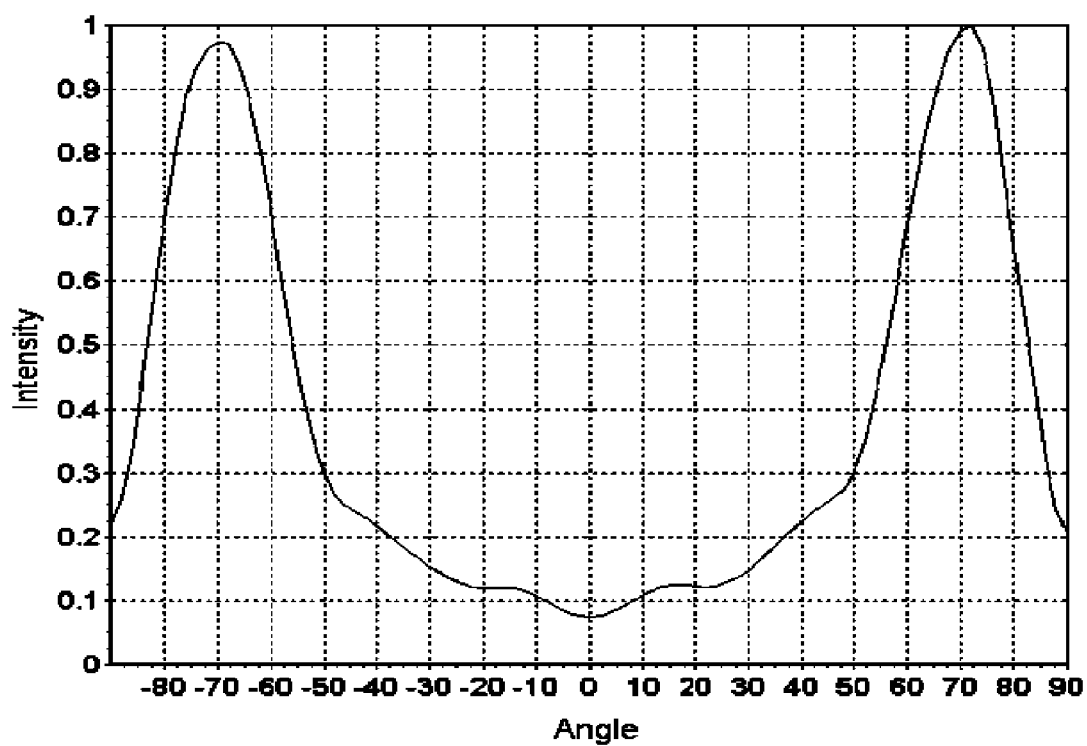

SIDE ILLUMINATION LENS AND LUMINESCENT DEVICE USING THE SAME

CROSS REFERENCE TO RELATED APPLICATIONS

This application is a continuation of U.S. application Ser. No. 11/576,882 filed on Apr. 6, 2007, which is the National Stage Entry of International Application No. PCT/KR05/03346, filed on Oct. 7, 2005, and claims priority from and the benefit of Korean Patent Application No. 2005-0083743, filed on Sep. 8, 2005, Korean Patent Application No. 2005-0056436, filed on Jun. 28, 2005, Korean Patent Application No. 2005-0000269 filed on Jan. 3, 2005 and Korean Patent Application No. 2004-0079909, filed on Oct. 7, 2004, which are all hereby incorporated by reference for all purposes as if fully set forth herein.

TECHNICAL FIELD

The present invention relates to a side illumination lens and a luminescent device using the same, and more particularly, to a side illumination lens utilizing total internal reflection and a luminescent device using the lens.

BACKGROUND ART

In general, a light emitting diode (LED) is a device utilizing a phenomenon in which minority carriers (electrons or holes) injected by means of a p-n junction structure of a semiconductor are produced, and light is emitted due to recombination of the carriers. Conventionally, colors of light emitted by a light emitting diode are only red and green, and thus, the conventional light emitting diode has its use limited to a display device.

With the development of technology, however, light emission is allowed in various ranges of wavelength, in addition to blue light emission. Thus, a light emitting diode has begun to be used in a variety of fields. In particular, as white light emission is realized, the use of the light emitting diode is expanded to an illumination device as well as a backlight for a liquid crystal display.

However, since the direction of light emitted by a light emitting diode is random, the light should be induced in a desired direction to be used as an illumination device and a backlight. To induce light in the prior art, as shown in FIG. 1, a luminescent chip 11 is mounted on a substrate 10, molding is performed to form a convex lens 12 over the luminescent chip 11, and a pattern 13 for diffused reflection is formed on the surface of the convex lens 12 so that light can be spread widely. As shown in FIG. 2, reflection cups 14 are formed at both sides of the luminescent chip 11 to enhance focusing of light. Since the aforementioned luminescent device mainly emits light forward rather than sideward, there is a problem in that it is difficult to apply the luminescent device to a backlight which should widely emit light sideward.

Accordingly, studies on development of a device capable of emitting light in side directions of a lens have been actively conducted using the total internal reflection (TIR) property of light. Conventional lenses using TIR are disclosed in U.S. Pat. Nos. 6,679,621, 6,607,286 and 6,598,998. In the patents, a lens comprises a total reflection surface which is formed on the lens and has a predetermined slope, and a plurality of refractive surfaces which have different slopes and through which light reflected by the total reflection surface is emitted to the outside. Since the conventional lens has the plurality of refractive surfaces formed on right and left sides of the total reflection surface, there is a problem in that a process of fabricating the lens is complicated and fabricating costs increase. That is, there are the following problems: if a lens is fabricated using a mold, upper and lower mold parts and right and left mold parts are required; and if a lens is fabricated by means of a casting or grinding method, it cannot be easily fabricated in view of its shape.

DISCLOSURE OF INVENTION

Technical Problem

Accordingly, the present invention is conceived to solve the aforementioned problems. An object of the present invention is to provide a side illumination lens, which comprises a total internal reflection surface with a total reflection slope and a linear and/or curved refractive surface(s) extending therefrom, thereby achieving side luminescence, facilitating a fabricating process thereof and reducing fabricating costs, and a luminescent device using the side illumination lens.

Technical Solution

The present invention provides a lens comprising a body, a total reflection surface with a total reflection slope with respect to a central axis of the body, and a linear and/or curved refractive surface(s) formed to extend from a periphery of the total reflection surface.

Here, the refractive surface may comprise a linear refractive surface formed by being bent at the periphery of the total reflection surface, and a curved refractive surface formed to extend from a periphery of the linear refractive surface. Alternatively, the refractive surface may comprise a curved refractive surface formed to extend from the periphery of the total reflection surface, and a linear refractive surface formed by being bent at a periphery of the curved refractive surface.

Preferably, the curved refractive surface takes the shape of an ellipse, and a ratio of minor and major axes of the ellipse is 1:4 or less. The linear refractive surface may be bent more than once.

The total reflection surface may comprise a first total reflection surface having a section in the form of a V-shaped recess with a predetermined slope, and a second total reflection surface extending upward from a periphery of the first total reflection surface and formed to be sloped with a gradient smaller than that of the first total reflection surface.

The refractive index of the body may be 1.2 to 2.0.

The present invention provides a luminescent device comprising a package housing with an opening and a through-hole exposed by the opening; a lead terminal having an inner portion exposed within the opening of the package housing and an outer portion extending from the inner portion and protruding to the outside of the package housing; a heat sink coupled to a lower portion of the package housing and having a portion exposed through the opening; and a lens including a total reflection surface encapsulating the package housing and having a total reflection slope, and a refractive surface formed to extend from a periphery of the total reflection surface.

Here, the package housing may comprise first and second housings mutually coupled to each other with the lead terminal interposed therebetween, and the opening may be formed in the first housing.

The heat sink may comprise a heat sink body corresponding to a bottom surface of the package housing, and an insertion projection protruding upward from a central portion of the heat sink body and inserted into the through-hole of the package housing. At this time, the heat sink may have a coupling projection on at least one side of the heat sink body and the insertion projection.

The present invention provides a luminescent device comprising a heat sink support ring; a heat sink inserted into the support ring; at least two lead terminals arranged at both sides of the support ring while being spaced apart from the support ring and the heat sink; a package body that molds and supports the heat sink and the lead terminals, and has an opening through which an upper portion of the heat sink and portions of the lead terminals are exposed; and a lens including a total reflection surface encapsulating the package body and having a total reflection slope, and a refractive surface formed to extend from a periphery edge of the total reflection surface.

Here, the heat sink may have a base and a projection protruding upward from the base at the center thereof, and the projection is inserted into the support ring.

The heat sink may further comprise a support ring-receiving groove in a side surface of the projection so that the support ring-receiving groove can be fastened to the support ring. The package body may be a plastic resin body formed by insert-molding a thermosetting or thermoplastic resin after the heat sink is inserted into the support ring.

ADVANTAGEOUS EFFECTS

As described above, according to the present invention, a lens with total internal reflection surfaces with different slopes, and a linear and/or curved refractive surface(s) allows light emitted forward from a luminescent chip to be guided to a side of the lens.

Further, a linear surface(s) formed in a direction perpendicular or parallel to a central axis of a lens and a curved surface are formed on an edge of the lens so that a process of fabricating the lens is facilitated, thereby reducing a defective rate and fabrication costs of the lens.

Moreover, it is possible to provide a luminescent device employing a heat sink to exhibit superior heat dissipation property, thereby obtaining high output of light.

Furthermore, after a heat sink is fixed to a frame, a package body can be formed using an insert molding technique, so that a luminescent device with a structure in which lead terminals and the heat sink are mutually coupled to each other can be easily fabricated.

In addition, it is possible to provide a frame that allows a heat sink to be fixed before a package body is formed, so that fabrication of a luminescent device is facilitated.

Further, there is an advantage in that a large quantity of luminescent devices can be mass-produced at a high rate because a method of fabricating the luminescent devices is similar to that of conventional top luminescent devices.

BRIEF DESCRIPTION OF THE DRAWINGS

FIGS. 1 and 2 are sectional views of conventional luminescent devices.

FIG. 3 is a conceptual view illustrating a critical angle.

FIG. 4 is a sectional conceptual view of a luminescent device with a lens according to a first embodiment of the present invention.

FIG. 5 is a plan view of the lens according to the first embodiment.

FIG. 6 is a conceptual view illustrating the operation of the total internal reflection lens according to the first embodiment.

FIG. 7 is a graph showing simulation results of the luminescent device with the lens according to the first embodiment.

FIGS. 8 and 9 are graphs showing experimental measurement results.

FIG. 10 shows plan and side views of an external frame for use in mass-producing a luminescent device according to a first modification of the embodiment.

FIG. 11 is an exploded perspective view illustrating a luminescent device with a heat sink according to the first modification.

FIG. 12 shows enlarged plan and side views illustrating a state where the luminescent device with the heat sink according to the first modification is formed in an external frame.

FIGS. 13 (a) and (b) are top and bottom perspective views of the luminescent device according to the first modification.

FIGS. 14 (a) and (b) and FIG. 15 (a) to (c) are sectional views of the luminescent device according to the first modification.

FIG. 16 is a perspective view illustrating a lead frame for use in mass-producing a luminescent device according to a second modification of the embodiment.

FIG. 17 is a flowchart illustrating a method of fabricating the luminescent device according to the second modification.

FIGS. 18 to 28 are perspective views illustrating the method of fabricating the luminescent device in accordance with the flowchart.

FIG. 29 is a conceptual sectional view of a luminescent device with a lens according to a second embodiment of the present invention.

FIG. 30 is a perspective view of the lens according to the second embodiment.

FIG. 31 is a conceptual view illustrating the operation of the total internal reflection lens according to the second embodiment.

FIG. 32 is a graph showing simulation results of the luminescent device according to the second embodiment.

FIG. 33 is a conceptual sectional view of a luminescent device with a lens according to a third embodiment of the present invention.

FIG. 34 is a perspective view of the lens according to the third embodiment.

FIG. 35 is a conceptual view illustrating the operation of the total internal reflection lens according to the third embodiment.

FIG. 36 is a graph showing simulation results of the luminescent device according to the third embodiment.

FIG. 37 is a conceptual sectional view of a luminescent device with a lens according to a fourth embodiment of the present invention.

FIG. 38 is a perspective view of the lens according to the fourth embodiment.

FIG. 39 is a conceptual view illustrating the operation of the total internal reflection lens according to the fourth embodiment.

FIG. 40 is a graph showing simulation results of the luminescent device according to the fourth embodiment.

FIG. 41 is a conceptual sectional view of a luminescent device with a lens according to a fifth embodiment of the present invention.

FIG. 42 is a perspective view of the lens according to the fifth embodiment.

FIG. 43 is a conceptual view illustrating the operation of the total internal reflection lens according to the fifth embodiment.

FIG. 44 is a graph showing simulation results of the luminescent device according to the fifth embodiment.

BEST MODE FOR CARRYING OUT THE INVENTION

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like elements are designated by like reference numerals.

FIG. 3 is a conceptual view illustrating a critical angle.

Referring to FIG. 3, the critical angle refers to the smallest incidence angle $\theta_c$ of at which total internal reflection occurs at a refractive boundary when light travels from a material with a high refractive index n1 to another material with a low refractive index n2. That is, if light meets and is refracted on the other material (n2<n1) as shown in FIG. 3 (b), the incidence angle that results in a refraction angle of 90 degrees is referred to as the critical angle. At this time, the incidence angle refers to an angle $\theta_{c1}$ measured with respect to the normal at the refractive boundary. If an incidence angle is greater than the critical angle, total internal reflection occurs.

In a case where light is vertically incident from one medium n1 on another medium n2 in the two different media (n2<n1) as shown in FIG. 3 (b), if a boundary surface of the medium n1 has a certain slope, an angle defined between the incident light and the normal perpendicular to the boundary surface becomes greater than the critical angle ($\theta_{c2} > \theta_{c1}$). As a result, the light is not transmitted through the other medium n2 after passing through the medium n1 but is reflected toward the inside of the medium n1.

With the use of the total internal reflection phenomenon of light, the light is not transmitted but reflected even on a transparent surface. Here, one of the media may be a material with superior transmittancy, and the other medium may be air.

Embodiment 1

FIG. 4 is a sectional conceptual view of a luminescent device with a lens according to a first embodiment of the present invention, FIG. 5 is a plan view of the lens according to the first embodiment, FIG. 6 is a conceptual view illustrating the operation of the total internal reflection lens according to the first embodiment, FIG. 7 is a graph showing simulation results of the luminescent device with the lens according to the first embodiment, and FIGS. 8 and 9 are graphs showing experimental measurement results.

Referring to FIGS. 4, 5 and 6, the luminescent device with the lens according to this embodiment comprises a substrate 100; a luminescent chip 110 mounted on the substrate 100; and a lens that encapsulates the luminescent chip 110 and has a V-shaped first total reflection surface 121 with a predetermined slope with respect to a central axis, a second total reflection surface 122 extending outward therefrom with a slope smaller than that of the first total reflection surface 121, and a curved refractive surface 123 extending downward from a periphery of the second total reflection surface 122. Here, it is preferred that the curved refractive surface be in the form of a part of an ellipse.

First, the aforementioned lens of this embodiment will be described below.

The first total reflection surface 121 is made in the form of a V-shaped recess over the luminescent chip 110, the curved refractive surface 123 is formed to be rounded downward from the periphery of the second total reflection surface 122, and the second total reflection surface 122 is formed to be inclined upward between the recess and a periphery of the refractive surface 123. Assuming that the height T of the entire lens 120 is 1 as shown in FIG. 4, the height T2 of the first reflection surface 121 is ¼ to ½, and the height T1 of the second reflection surface 122 is ¼ to ½. As shown in the figure, the height of the refractive surface is the same as the entire lens. Assuming that the diameter C of the entire lens 120 is 1 as shown in FIG. 5, the maximum diameter A of the first reflection surface 121 is ⅛ to ⅓, and the maximum diameter B of the second reflection surface 122 is ⅙ to ½.

Further, it preferred that the curved refractive surface 123 be made in the form of an ellipse and a ratio of minor and major axes of the ellipse be in a range of 1:2 to 1:4.

More preferably, the ratio of the minor and major axes is 1:3.

At this time, as described above, each of the slopes of the reflection surfaces 121 and 122 should be set such that an angle defined by the total reflection surface and light emitted from the luminescent chip 110 and incident on the total reflection surface becomes greater than a critical angle. That is, since the critical angle varies depending on a refractive index of the lens 120, the lens 120 of this embodiment is made of a material with a refractive index of 1.2 to 2.0 so that the critical angle becomes 30 to 60 degrees.

As such, in order that the angle defined by the total reflection surface and light incident on the total reflection surface 121 or 122 becomes greater than the critical angle, this embodiment is implemented such that the slope of the first reflection surface 121 is 30 to 89 degrees, and the slope of the second reflection surface 122 is 20 to 60 degrees. At this time, the slopes refer to angles defined by the first and second reflection surfaces 121 and 122 and the lower substrate 100. Preferably, the slope of the first reflection surface 121 is 40 to 70 degrees and the slope of the second reflection surface 122 is 30 to 50 degrees.

Accordingly, as shown in FIG. 6, light that is incident from a light source (luminescent chip) in a range of ±40 to ±45 with respect to an x-axis direction (vertical direction) is totally reflected on the first and second total reflection surfaces 121 and 122 toward sides of the lens 120 (in a horizontal direction), and then emitted in a y-axis direction through the single elliptical refractive surface 123. Meanwhile, light that is incident out of the range of ±40 to ±45 degrees with respect to the x-axis direction is immediately refracted through the curved refractive surface 123 and then emitted in the y-axis direction. In this embodiment, based on about 42 degrees, light is totally reflected on the total reflection surfaces 121 and 122 and then emitted through the refractive surface at the side of the lens, or the light is emitted through the refractive surface without being reflected by the total reflection surfaces 121 and 122.

As such, the lens 120 of the present invention is constructed to have the total reflection surfaces with different slopes with respect to a central axis and the curved refractive surface 123 at the periphery of the lens, so that a peak value of luminous intensity is located in a range of ±10 with respect to ±80 as shown in FIGS. 7, 8 and 9. Further, the luminous intensity at zero degrees is minimized to be 0 to 20% of the peak value. Preferably, it is minimized to be 5 to 10% of the peak value.

In FIG. 7, a simulation was made on condition that a lens 120 with a refractive index of 1.5 was used, an angle defined by the first total reflection surface 121 and light emitted from the luminescent chip 110 was about 50 degrees, which was greater than the critical angle, and an angle defined by the second total reflection surface 122 and light emitted from the luminescent chip 110 was about 43 degrees. Then, luminous intensity was measured in a range of +90 to −90 degrees with respect to a region where the luminescent chip was located. The simulation results are shown in the graph. As shown in the graph of FIG. 7, the luminous intensity is the highest in the vicinity of ±80 degrees. That is, the luminous intensity is about 0.93 at −80 degrees and about 0.96 at +78 degrees. The luminous intensity is not greater than 0.1 in a range of ±40 degrees.

In FIG. 8, an experiment was performed on condition that a lens 120 with a refractive index of 1.5, an angle defined by the first total reflection surface 121 and light emitted from the luminescent chip 110 was about 50 degrees, which was greater than the critical angle, and an angle defined by the second total reflection surface 122 and light emitted from the luminescent chip 110 was about 43 degrees. Then, luminous intensity was measured in a range of +90 to −90 with respect to a region where the luminescent chip was located. The experimental results are shown in the graph. In FIG. 9, the results are shown in polar coordinates. As shown in the graphs of FIGS. 8 and 9, the luminous intensity is the highest in the vicinity of ±75 degrees with respect to the luminescent chip, i.e., a luminescent device. That is, the luminous intensity is about 1 at −74 degrees and about 0.99 at +78 degrees. The luminous intensity is not greater than 0.1 in a range of ±20 degrees and not greater than 0.2 in a range of +40 degrees.

This is because light totally reflected on the first and second reflection surfaces 121 and 122, and light refracted through the refractive surface 123 travels in the side direction of the luminescent device.

The aforementioned lens 120 of the present invention may be fabricated through an injection molding process or through a grinding process of grinding a top surface of the lens 120 with an elliptical contour. In the case where the lens of the present invention is fabricated by means of such fabricating methods, since the lens has a refractive surface in the form of a single elliptical refractive surface, the lens can be easily fabricated, thereby reducing a defective rate and fabricating costs. In addition, as compared with the aforementioned prior art in which a plurality of refractive surfaces of a lens have their slopes over certain distances, resulting in a large size, the present invention enables improvement of side illumination effects and fabrication of a lens with a compact size since the lens has a single refractive surface in the form of an ellipse.

Further, the conventional lens has the refractive surfaces in the form of sawteeth indented toward a central axis, but the lens of the present invention has the refractive surface formed to extend outward from the periphery of the total reflection surface.

All types of luminescent chips for emitting light through PN junction can be used as the luminescent chip 110, and a plurality of luminescent chips 110 may be mounted on the substrate.

A first modification of a luminescent device including the lens according to the aforementioned first embodiment will be described below with reference to the accompanying drawings.

FIG. 10 shows plan and side views of an external frame for use in mass-producing a luminescent device according to the first modification of the embodiment, FIG. 11 is an exploded perspective view illustrating a luminescent device with a heat sink according to the first modification, and FIG. 12 shows enlarged plan and side views illustrating a state where the luminescent device with the heat sink according to the first modification is formed in an external frame.

As shown in FIG. 10, the external frame 201 for use in fabricating luminescent devices according to this modification is formed with a plurality of unit bodies each of which comprises lead terminals 200 and connection terminals 210 at a predetermined interval. The lead terminals 200 are formed in pairs integrally with the connection terminals 210, and the connection terminals 210 are formed as a symmetric structure to define a hollow portion 240 with a predetermined shape on a central axis. For the sake of easy description of the structure of the lead terminal, the lead terminal 200 and the connection terminal 210 are described as separate members. However, the term "lead terminal" may be used to express a meaning including both the lead terminal 200 and the connection terminal 210.

Further, as described above, the connection terminals 210 defining the hollow portion 240 are supported by panel supports 220 to be fixed to the external frame 201, and the panel supports perform the function of fixing the positions of the connection terminals 210 when first and second package housings 300 and 310 to be described later are fixed.

In the meantime, although the hollow portion 240 formed at the center of the symmetric connection terminals 210 has a hexagonal shape in this modification, it may take the shape of a circle or a polygon with more than four sides.

After the external frame 201 for use in fabricating the luminescent device according this modification is formed as such, the first and second package housings 300 and 310, and a heat sink 330 are sequentially secured thereto to form a structure shown in FIG. 11.

That is, the first package housing 300 with a predetermined shape (rectangular shape) is located on the top of the pair of connection terminals 210 formed integrally with the lead terminals 200 in the external frame 201, and the second package housing 310 is located on the bottom of the connection terminals 210. Further, the lens 120 with the total reflection surfaces 121 and 122 and the refractive surface 123 according to the embodiment is fixed on the first package housing 300.

The first package housing 300 is recessed at a central portion thereof to contain an encapsulant and has a through-hole 380 for exposing the hollow portion 240 and terminal portions of the connection terminals 210 at the bottom thereof. Although the through-hole 380 has the same area as the recessed portion, it may have an area smaller than that of the recessed portion as shown in the figure. The recessed portion and the through-hole 380 form an opening portion of the package housing. A stepped portion 390 is formed in an inner surface of the recessed portion to contain the encapsulant, which will be described later, for a luminescent device.

An upper surface of the second package housing 310 is formed with receiving grooves 320 that have the same shape as the connection terminals 210 to receive the connection terminals 210 therein, and a lower surface of the second package housing 310 is formed with a heat sink-seating grooves 370 into which the heat sink 330 to be described later can be inserted.

Further, a circular through-hole 350 is formed at the center of the second package housing 310 to receive an insertion projection 340 of the heat sink 330 therein, and an inner space of the insertion projection 340 becomes a luminescent chip-seating portion 360 in which a luminescent chip 400 to be described later will be fixedly seated.

Meanwhile, the first and second package housings 300 and 310 in the present invention can be made of materials such as thermal conductive plastics or high thermal conductive ceramics. The thermal conductive plastics include acrylonitrile butadiene styrene (ABS), liquid crystalline polymer (LCP), polyamide (PA), polyphenylene sulfide (PPS), thermoplastic elastomer (TPE) and the like. The high thermal conductive ceramics include alumina ($Al_{20}_3$), silicon carbide (SiC), aluminum nitride (AlN) and the like. Among the ceramics, aluminum nitride (AlN) has properties equivalent to those of alumina and is superior to alumina in view of thermal conductivity. Thus, aluminum nitride has been widely used in practice.

In a case where the material of the first and second package housings 300 and 310 thermal conductive plastics, the first package housing 300 and the second package housing 310 are respectively located on the top and bottom of the connection terminals 210 symmetrically formed in the external frame 201, and then fixedly attached thereto through compression at high temperature. Here, it is important to consider the shape of the through-hole 380 and the stepped portion 390, which are formed within the first package housing 300. That is, the through-hole 380 and the stepped portion 390 are formed by locating the first and second package housings 300 and 310 on the top and bottom of the external frame 201 and by pressing them using a pressing means with a projection, which takes the shape corresponding to the shape of the though-hole 380 and the stepped portion 390, at high temperature.

Meanwhile, in a case where the material of the first and second package housings 300 and 310 is ceramics, the first package housing 300 and the second package housing 310 are fabricated in advance to have an accurate size and shape. That is, since the ceramics cannot be formed into a desired shape in a final application step due to its property by which the ceramics is formed into a desired shape at a high temperature of greater than 1000.degree. C., the first and second package housings 300 and 310 are fabricated in advance to have a precise size and shape. At this time, the through-hole 380 and the stepped portion 390 should be formed in the first package housing 300 to be fabricated.

Therefore, the ceramic first and second package housings 300 and 310 fabricated in advance as described above are respectively located on the top and bottom of the connection terminals 210 of the external frame 201, and then fixedly attached thereto using an adhesive with high adhesive strength.

A luminescent device to be assembled into the external frame 201 fabricated as above is formed on each of the unit bodies each of which comprises the lead terminals 200 formed in the external frame 201 and the connection terminals 210 formed in the symmetrical manner integrally with the lead frames, as shown in FIG. 12.

Further, at least one luminescent chip 400 is fixedly attached to the luminescent chip-seating portion 360 at the center of the heat sink 330 constituting the luminescent device formed as described above, and the luminescent chip is electrically connected to the connection terminals 210 through connection wires 420.

Further, a zener diode 410 can be mounted in the luminescent chip-seating portion 360 and then connected, with polarity matching, to the mounted luminescent chip 400 through the connection wire 420 so as to electrically protect the luminescent chip 400.

The zener diode 410 is a semiconductor device using a phenomenon in which when a relatively high reverse voltage is applied to a p–n or n–p junction of a semiconductor, a high current is started to rapidly flow with a certain voltage, and the voltage is sustained to be constant. If the zener diode 410 is applied to the luminescent device, a constant voltage can be sustained even though static electricity or a sudden current is supplied, thereby enhancing reliability of a product.

FIGS. 13 (a) and (b) are top and bottom perspective views of the luminescent device according to this modification, and FIGS. 14 (a) and (b) and FIG. 15 (a) to (c) are sectional views of the luminescent device according to this modification.

A plurality of luminescent devices according to this modification are formed in the external frame 201 through the aforementioned fabricating process, and each of the formed luminescent devices is cut and withdrawn from the external frame 201 around the first and second package housings 300 and 310.

In the withdrawn luminescent device of the present invention, as shown in FIG. 13, the lead terminals 200 are bent by a predetermined length and at a predetermined angle to match with connection terminals on a PCB substrate.

As shown in FIGS. 13 (b) and 14, the heat sink 330 of the luminescent device according to the present invention is fixed to the bottom of the second package housing 310 while being inserted upward thereinto, such that it protrudes beyond the lower surface of the second package housing 310. That is, this is because the surface of the heat sink 330 protruding downward beyond the lower surface of the second package housing 310 is intended to come into direct contact with a heat dissipation member (not shown) so as to maximize heat dissipation effects when the luminescent device is fabricated and applied in practice.

Further, as shown in FIG. 14, stepped portions 390a and 390b (collectively designated by 390) are doubly formed within the inner space of the first package housing 300, so that they can be used as fixing steps required for molding the encapsulant to be described later or for mounting the lens 120 with the total reflection surfaces and the refractive surface according to this embodiment.

Further, an outer surface of the insertion projection 340 of the heat sink 330 constituting the luminescent device is formed with a latching step 340a to be fixedly inserted into a groove formed in a wall defining the through-hole 350 in the second package housing 310, so that the insertion projection 340 of the heat sink 330 can be firmly fixed to the through-hole 350 of the second package housing 310. The latching step 340a may be formed on the body of the heat sink. The latching step 340a may be formed at an edge of an uppermost portion of the insertion projection 340 of the heat sink 330. At this time, the latching step 340a is coupled to the upper surface of the second package housing 310, thereby fixing the heat sink 330.

Meanwhile, in the luminescent device according to this modification, the encapsulant 450 for protecting the luminescent chip 400 and the connection wires 420 while transmitting light emitted from the luminescent chip 400 is molded within the inner space of the first package housing 300.

As shown in FIG. 15 (a), the encapsulant 450 may be epoxy resin and contain a fluorescent substance for converting light emitted from the luminescent chip 400.

In addition, the encapsulant 450 may contain a diffusing substance for uniform distribution of light.

Further, as shown in FIG. 15 (b), if the encapsulant 450 is epoxy resin containing a fluorescent substance, the encapsulant may be further molded with the epoxy resin 470 on the top thereof to obtain more stable molding effects.

Further, as shown in FIG. 15 (c), the luminescent device is molded with the encapsulant 450 as shown in FIGS. 15 (a) and (b), and the lens 120 with the total reflection surfaces 121 and 122 and the refractive surface 123 according to the present invention is then fixed to the upper stepped portion 390b of the first package housing 300 to ensure side luminescence and to more stably protect the internal, mounted objects (luminescent chip and bonding wires).

Although the molding with the encapsulant and the subsequent fixing of the lens have been described in the above, this modification is not limited thereto. The encapsulant and the lens may be formed integrally with each other. That is, the encapsulant may be formed with total reflection surfaces and a refractive surface on the top thereof so that it can function as the lens of the present invention, or the lens may also be used as the encapsulant.

A luminescent device including the lens of the embodiment in accordance with a second modification will be described below with reference to the accompanying drawings.

FIG. 16 is a perspective view illustrating a lead frame for use in mass-producing the luminescent device according to the second modification of the embodiment, FIG. 17 is a flowchart illustrating a method of fabricating the luminescent device according to this modification, and FIGS. 18 to 21 are perspective views illustrating the method of fabricating the luminescent device in accordance with the flowchart.

First, a lead frame in this modification will be described with reference to FIG. 16.

Referring to FIG. 16, the lead frame 500 has a heat sink support ring 530 into which a heat sink can be inserted thereinto. The support ring 530 may be in the form of a circular ring as shown in the figure. However, it is not limited thereto but may be in the form of a polygonal ring.

In the meantime, an external frame 510 surrounds the support ring 530. The external frame 510 is located to be spaced apart from the support ring 530. The external frame 510 may be in the form of a square as shown in the figure. However, it is not limited thereto but may be in the form of a circle or other polygons.

The external frame 510 and the support ring 530 are connected by at least two connection terminals 550a and 550b. The connection terminals 550a and 550b are located on both opposite sides of the external frame 510 and fix the support ring 530 to the external frame 510. Additional connection terminals except the connection terminals 550a and 550b may connect the support ring 530 to the external frame 510.

Further, at least two lead terminals 570a, 570b, 570c, 590a, 590b and 590c extend toward the support ring 530 from the external frame 510. However, the lead terminals are spaced apart from the support ring 530. As shown in the figure, the lead terminals 570a, 570b, 570c, 590a, 590b and 590c have wider distal ends in the vicinity of the support ring 530. Meanwhile, it is preferred that the lead terminals be arranged on both opposite sides of the external frame 510.

The number of required lead terminals is determined depending on the kinds and number of luminescent chips to be mounted and bonding wire-connecting methods.

However, it is preferred that the lead frame 500 have a large number of lead terminals to be used in a variety of cases. As shown in the figure, the lead terminals are arranged in a direction perpendicular to the connection terminals 550a and 550b, so that a large number of lead terminals can be arranged in an identical direction.

The lead frame 500 according to an embodiment of the present invention can be fabricated by pressing a plate made of phosphor bronze, which is a copper alloy, using a press die. Meanwhile, although one lead frame 500 is shown in FIG. 16, a plurality of lead frames 500 may be fabricated and arranged in one phosphor bronze plate. In particular, a plurality of lead frames 500 fabricated in one phosphor bronze plate are used for mass production of the luminescent device.

Referring to FIG. 17, the lead frame 500 described above with reference to FIG. 16 is prepared (S01).

As described above, the lead frame 500 can be fabricated by pressing a phosphor bronze plate, and a plurality of lead frames 500 can be fabricated and arranged in one phosphor bronze plate.

Referring to FIGS. 17 and 18, a heat sink 600 fixedly insertable into the support ring 530 of the lead frame 500 is prepared. The heat sink 600 has a top surface on which a luminescent chip is to be mounted. It is preferred that the top surface of the heat sink 600 have a diameter smaller than the inner diameter of the support ring 530 so that the heat sink can be easily inserted thereinto and that the outer diameter of the side of the heat sink 600 be larger than the inner diameter of the support ring 530.

Further, the heat sink 600 may have a support ring-receiving groove 630a enabling the heat sink to be fastened to the support ring 530. Furthermore, the support ring-receiving groove 630a may be provided as a spiral groove for facilitating the fastening thereof to the support ring 530.

Meanwhile, the heat sink 600 may have a base 610 and a projection 630 protruding upwardly from the center of the base 610. At this time, the support ring-receiving groove 630a is disposed in a side surface of the projection 630. The base portion 610a and the projection 630 may be in the form of cylinders as shown therein. However, they are not limited thereto but may be in the form of polygonal posts. Although the projection 630 can have a shape similar to an inner shape of the support ring 530, it is not limited thereto. That is, the support ring 530 may be in the form of a circular ring, and the projection 630 may be in the form of a square post.

The heat sink 600 can be fabricated of a metal with high thermal conductivity or a thermal conductive resin using a press or molding technique. The heat sink 600 is fabricated using a process separate from a process of preparing the lead frame 500. Therefore, the order of the steps of preparing the lead frame 500 (S01) and the heat sink 600 (S03) may be changed, or the steps may be performed at the same time.

Referring to FIGS. 17 and 19, the heat sink 600 is fixedly inserted into the support ring 530 of the lead frame 500 (505). Since the outer diameter of the side of the heat sink 600 is larger than the inner diameter of the support ring 530, the heat sink 600 can be forcibly inserted into and fixed to the support ring 530.

Meanwhile, if the support ring-receiving groove 630a is formed, the support ring 530 is received in the support ring-receiving groove 630a and supports the heat sink 600. At this time, it is preferred that a portion of the support ring 530 be received in the support ring-receiving groove 630a, and the remainder thereof protrude to an outer surface of the projection 630, as shown in figure. Further, if the support ring-receiving groove 630a is a spiral groove, the heat sink 600 can be screwed and fastened to the support ring 530.

Referring to FIGS. 17 and 20, after the heat sink 600 is fixed to the lead frame 500, a package body 700 is formed using an insert molding technique (507). The package body 700 can be formed through insert molding with a thermosetting or thermoplastic resin.

The package body 700 is formed around the heat sink 600 to support the support ring 530, the connection terminals 550a and 550b, the lead terminals 570a, 570b, 570c, 590a, 590b and 590c, and the heat sink 600. Some portions of the connection terminals and the lead terminals protrude to the outside of the package body 700. Further, the package body 700 has an opening through which an upper end of the heat sink 600 and the lead terminals are exposed.

As shown in FIG. 20, some portions of the support ring 530 and the connection terminals 550a and 550b can be exposed through the opening. Accordingly, a groove is formed in the top of the package body 700. On the contrary, as shown in FIG. 21, the package body 700 can cover most portions except the upper end of the heat sink 600, and expose only some portions of the lead terminals. Thus, a plurality of sub-openings can be defined.

Even in this case, it is preferred that a groove surrounded by the sidewall of the package body be also formed at an upper portion of the package body 700, as shown in the figure.

Further, the lower surface of the heat sink 600 is exposed to the outside. In addition thereto, the side of the base portion 610 may also be exposed. Accordingly, heat dissipation through the heat sink 600 can be promoted.

Meanwhile, although the package body 700 can take the shape of a cylinder, as shown in FIGS. 20 and 21, it is not limited thereto but may be the shape of a polygonal post such as a square post.

After the heat sink 600 is coupled to the lead frame 500, the package body 700 is formed by insert-molding a thermosetting or thermoplastic resin, so that the heat sink 600 and the package body 700 are strongly coupled to with each other.

Referring to FIGS. 17 and 22, portions of the connection terminals 550a and 550b, which protrude to the outside of the package body 700, are cut and removed (S09). As a result, the cut connection terminals 560a and 560b are left in the package body 700, and these connection terminals and the support ring 530 more prevent the heat sink 600 from being separated from the package body 700.

In the meantime, while the connection terminals are cut, the remainder of the lead terminals except some lead terminals, which are intended to be used for applying a current, among the lead terminals protruding to the outside of the package body 700 may be cut and removed together with the connection terminals. For example, as shown in FIG. 23, in a case where only two lead terminals 570c and 590c are needed, the remainder of the lead terminals 570a, 570b, 590a and 590b are cut and removed. Further, as shown in FIG. 24, in a case where four lead terminals 570a, 570c, 590a and 590c are needed, the remainder of the lead terminals 570b and 590b are cut and removed.

The process of cutting and removing the lead terminals is a process performed in a case where lead terminals of which the number is larger than that of lead terminals required in a luminescent device are provided in the lead frame 500. Thus, if the number of lead terminals required in a luminescent device is identical with that of lead terminals provided in the lead frame 500, the process of cutting and removing lead terminals is not performed. Further, since left excess lead terminals, if any, do not influence the operation of a luminescent device, the process of cutting and removing the excess lead terminals is not an inevitable process.

Referring to FIGS. 17 and 25, luminescent chips 800 are mounted on an upper surface of the heat sink 600 (S11). The luminescent chip 800 may be a one-bond die with an electrode on each of top and bottom surfaces thereof or a two-bond die with two electrodes on a top surface thereof.

If the luminescent chip 800 is a one-bond die, it is preferred that the heat sink 600 be made of a metallic material with electric conductivity. At this time, the luminescent chip 800 is mounted on the heat sink 600 by means of an electric conductive adhesive such as silver epoxy. Otherwise, if all the luminescent chips 800 to be mounted on the heat sink 600 are two-bond dies, the heat sink 600 is not necessarily to be electrically conductive, and they may be mounted on the heat sink 600, for example, by means of various kinds of thermally conductive adhesives.

In the meantime, a plurality of luminescent chips 800 may be mounted on the heat sink 600. Further, the plurality of luminescent chips 800 may be luminescent chips that can emit light with different wavelengths. For example, as shown in FIG. 25, three luminescent chips 800 can be mounted. At this time, the luminescent chips 800 may be luminescent chips for respectively emitting red, green and blue light.

Accordingly, a luminescent device emitting light with all kinds of colors can be provided using the luminescent chips 800.

Referring to FIGS. 17 and 26, luminescent chips 810, 830 and 850 and the lead terminals 570a, 570b, 570c, 590a, 590b and 590c are electrically connected through bonding wires (S13). In a case where all the luminescent chips 810, 830 and 850 are two-bond dice, each of the luminescent chips is connected to two lead terminals through two bonding wires. Meanwhile, as shown in the figure, the luminescent chips 810, 830 and 850 can be electrically connected to different pairs of lead terminals, respectively. Moreover, one common lead terminal (e.g., 570b) and the luminescent chips can be connected through the bonding wires, and the other lead terminals (e.g., 590a, 590b, 590c) located at a side opposite to the common lead terminal can be connected to the luminescent chips through different bonding wires, respectively. In this case, the luminescent chips can be driven with different currents, respectively.

Meanwhile, as shown in FIG. 27, a one-bond luminescent chip 810a and two-bond luminescent chips 830 and 850 can be mounted together. At this time, one lead terminal 570b of the lead terminals is electrically connected to the heat sink 600 through a bonding wire. Therefore, the lead terminal 570b is electrically connected to a bottom surface of the one-bond luminescent chip 810a through a bonding wire and the heat sink 600. There are various combinations of one-bond dies and two-bond dies, and one of various methods of connecting bonding wires in the combinations can be selected.

Further, one of various methods of connecting lead terminals to luminescent chips can be selected, and a plurality of luminescent chips may be connected in series, in parallel or in series-parallel.

In the meantime, after the luminescent chips 810, 830 and 850 and the lead terminals are connected through the bonding wires, the luminescent chips 810, 830 and 850 are encapsulated with an encapsulant (not shown) (S15). The encapsulant can encapsulate the luminescent chips and the bonding wires by filling the opening of the package body 700.

Further, the encapsulant can contain a fluorescent substance. For example, the fluorescent substance can convert the color of light from blue into yellow, or into green and red. Thus, if a luminescent chip emitting blue light is mounted on the heat sink 600, it is possible to provide a luminescent chip emitting white light to the outside by converting some of light emitted from the luminescent chip into yellow, or green and red light. In addition thereto, the encapsulant may further contain a diffusing substance. The diffusing substance prevents the luminescent chips and the bonding wires from being viewed from the outside by dispersing light emitted from the luminescent chips, and the diffusing substance also enables light to be uniformly emitted to the outside.

After the luminescent chips are encapsulated with the encapsulant, the lens 120 with the total reflection surfaces 121 and 122 and the refractive surface 123 according to this embodiment is attached on the package body 700 (S17). The lens 120 is used to emit light within a predetermined directional angle, which guides and emits light from the luminescent chip 800 toward the side of the lens in this embodiment.

Although the processes of forming the encapsulant and attaching the lens have been described above as separate processes for the sake of convenience of description, it is not limited thereto, and the luminescent chips may be encapsulated directly with a lens with total reflection surfaces and a refractive surface. That is, the total reflection surfaces and the refractive surface may be formed on the top of the encapsulant.

Referring to FIGS. 17 and 28, the lead terminals 570a, 570b, 570c, 590a, 590b and 590c are cut from the external frame 510 and then bent (S19). As a result, a luminescent device that can be subjected to surface mounting is obtained. Meanwhile, the step of cutting and removing the connection terminals (S09) may be performed together with step S19.

Next, the luminescent device of this modification will be described with reference to FIG. 28.

Referring back to FIG. 28, the luminescent device includes the heat sink support ring 530. The support ring 530 is made of a copper alloy such as phosphor bronze.

Although the support ring 530 can take the shape of a circular ring as shown in the figure, it is not limited thereto but may take the shape of a polygonal ring. The cut connection terminals 560a and 560b are disposed while extending from the outside of the support ring 530. The cut connection terminals 560a and 560b can be located at opposite sides of the support ring 530.

As described with reference to FIG. 18, the heat sink 600 is inserted into the support ring 530.

Meanwhile, at least two lead terminals 570a, 570b, 570c, 590a, 590b and 590c are arranged at the both sides of the support ring while being spaced apart from the support ring 530 and the heat sink 600. The lead terminals may be bent to enable surface mounting.

In addition thereto, the package body 700 supports the heat sink 600 and the lead terminals by means of molding. The package body 700 has the opening through which the upper end of the heat sink 600 and some portions of the lead terminals are exposed at the upper portion of the package body. Meanwhile, the portions of the lead terminals protruding outward through the sidewall of the package body 700 help prevent the heat sink 600 from being separated from the package body 700.

As described with reference to FIG. 20, some portions of the support ring 530 and the connection terminals 550a and 550b can be exposed through the opening. Accordingly, the grooves are formed at the upper portion of the package body 700. Further, as described with reference to FIG. 21, the package body 700 can cover most portions except the upper end of the heat sink 600 and expose only some portions of the lead terminals. Thus, a plurality of openings can be formed. Even in this case, it is preferred that the package body 700 have the groove surrounded by the sidewall of the package body as shown in FIG. 21.

The package body 700 is a plastic resin body formed by insert-molding a thermosetting or thermoplastic resin after the heat sink 600 is fixedly inserted into the support ring 530.

The luminescent chips 810, 830 and 850 are mounted and located on the upper surface of the heat sink 600. Although the luminescent chips shown in FIG. 28 are two-bond dies, they are not limited thereto. The luminescent chips may be one-bond dies or a combination of one-bond and two-bond dies.

The luminescent chips are electrically connected to the lead terminals through the bonding wires. In a case where the luminescent chips are two-bond dies, each of the luminescent chips is electrically connected to two lead terminals through two bonding wires. Meanwhile, in a case where at least one of the luminescent chips is a one-bond die, the heat sink is electrically connected to at least one lead terminal through a bonding wire.

There are various methods of connecting the lead terminals and the luminescent chips and one of them can be selected according to characteristics of required luminescent chips.

Meanwhile, the lens 120 with the total reflection surfaces 121 and 122 and the refractive surface 123 according to this embodiment covers and encapsulates the luminescent chips.

As described above, the luminescent device with the lens according to this embodiment is not limited to the aforementioned modification but may be applied to various kinds of luminescent chips.

Further, the present invention is not limited to the shape of the lens according to the embodiment but may further include a linear refractive surface.

A lens further comprising a horizontal linear refractive surface according to a second embodiment will be described below. In the following second embodiment, a description thereof overlapping with that of the previous embodiment will be omitted. Moreover, a description of a modification of a luminescent device with the lens will also be omitted since it overlaps with that of the previous embodiment.

Embodiment 2

FIG. 29 is a conceptual sectional view of a luminescent device with a lens according to a second embodiment of the present invention, FIG. 30 is a perspective of the lens according to the second embodiment, FIG. 31 is a conceptual view illustrating the operation of the total internal reflection lens according to the second embodiment, and FIG. 32 is a graph showing simulation results of the luminescent device according to the second embodiment.

Referring to FIGS. 29, 30 and 31, the lens of this embodiment comprises a first total reflection surface 1121 with a V-shaped section and a certain slope with respect to a central axis x; a second total reflection surface 1122 with a slope smaller than that of the first total reflection surface 1121; a linear first refractive surface 1123a extending from a periphery of the second total reflection surface 1122 in a direction perpendicular to the central axis x; and a curved second refractive surface 1123b extending downward from a periphery of the linear first refractive surface 1123a.

As shown in FIG. 29, the first total reflection surface 1121 is formed in the shape of a V-shaped recess above a luminescent chip 1110, and the second total reflection surface 1122 is formed to extend upward from the recess and to have a gradient smaller than that of the first reflection surface 1121 with respect to the central axis x. Meanwhile, the linear refractive surface 1123a is made in the form of a straight line parallel to a substrate 1100 on which the luminescent chip 1110 is to be mounted, and the curved second refractive surface 1123b is made in the form of a downward round curve extending from the first refractive surface 1123a. Of course, the first refractive surface 1123a may be formed to be parallel to the bottom of the lens 120. The first and second refractive surfaces 1123a and 1123b refer to surfaces that refract light guided to an edge of the lens toward the side thereof.

Assuming that the diameter of the entire lens 120 is 1 in the above, the first reflection surface 1121 is formed at the center of the lens 1120, and the maximum diameter of the first reflection surface 1121 is $1/12$ to $1/6$; the second reflection surface 1122 is formed to cover the first reflection surface 1121 and has the maximum diameter of $1/7$ to $1/3$; the first refractive surface 1123a is constructed in the form of a circular strip to surround the second reflection surface 1122 and has the maximum diameter of $1/5$ to $2/3$; and the diameter of the second refractive surface 1123b is identical with that of the entire lens 1120. Here, the width of the circular strip-shaped first refractive surface 1123a is $1/16$ to $1/8$ of the diameter of the lens. Assuming that the height of the lens 1120 is 1, the height of the first reflection surface 1121 is ⅙ to ½, and the height of the second reflection surface 1122 is ⅙ to ½.

The second refractive surface 1123b is made in the form of an ellipse as shown in FIG. 29, and a ratio of minor and major axes of the ellipse is in a range of 1:4 or less. That is, it may be a circle.

At this time, the slope of each of the total reflection surfaces 1121 and 1122 is set such that an angle defined by the total reflection surface and light, which is emitted from the luminescent chip 1110 and is then incident on the total reflection surface, becomes greater than a critical angle, as described above. That is, since the critical angle varies depending on a refractive index of the lens 1120, the lens 1120 of this embodiment is formed of a material with a refractive index of 1.2 to 2.0 so that the critical angle can be in a range of 30 to 60 degrees.

In order to cause the angle defined by the total reflection surface and light incident on the total reflection surface 1121 or 1122 to be greater than the critical angle, the slope of the first reflection surface 1121 is 30 to 89 degrees, and that of the second reflection surface 1122 is 20 to 60 degrees in this embodiment. At this time, the slopes refer to angles defined by the first and second reflection surfaces 1121 and 1122, and the lower substrate 1100. Preferably, the slope of the first total reflection surface 1121 is 40 to 70 degrees and that of the second total reflection surface 1122 is 30 to 50 degrees. Further, it is preferred that the slope of the first refractive surface 1123a be formed to be 10 degrees or less. However, it has been previously described as being in a horizontal state where its slope is zero.

Accordingly, as shown in FIG. 31, light R2 and R3, which is emitted from a light source (luminescent chip) and incident on the first and second total reflection surfaces 1121 and 1122, is totally reflected, and then emerges in a y-axis direction through the rounded second refractive surface 1123b. Light R4 and R1 incident on the first and second refractive surfaces 1123a and 1123b are refracted and then emerge in the y-axis direction.

As such, the lens 1120 of the present invention is formed to have the total reflection surfaces with different slopes at a central portion thereof, and the horizontal surface and the rounded surface at an edge portion thereof, so that a peak value of luminous intensity can be in a range of ±10 with respect to ±83, as shown in FIG. 32.

In FIG. 32, a lens 1120 with a refractive index of 1.5 was used such that an angle defined by the first total reflection surface 1121 and light emitted from the luminescent chip 1110 became about 50 degrees greater than the critical angle, and an angle defined by the second total reflection surface 1122 and light emitted from the luminescent chip 1110 became about 43 degrees. Then, luminous intensity was simulated in a range of +90 to −90 with respect to a region where the luminescent chip 1110 was located, and the results are shown in the graph. As shown in the graph of FIG. 32, the luminous intensity is the highest in the vicinity of ±83 degrees. That is, the luminous intensity is about 0.97 at +83 degrees and about 0.94 at −83 degrees. Further, the luminous intensity is not greater than 0.2 within ±40.

This is because light totally reflected on the first and second reflection surfaces 1121 and 1122, and light refracted through the first and second refractive surfaces 1123a and 1123b travels in the side direction of the luminescent device.

The lens 1120 of the present invention may be fabricated by means of an injection molding process or a grinding process of grinding a top surface of the lens 1120 with an elliptical curved surface. In a case of fabricating the lens of the present invention in this manner, since the lens is composed of the horizontal linear surface and the elliptical curved surface, its fabrication is facilitated, thereby reducing a defective rate and fabrication costs.

In addition, as described in the previous embodiment, as compared with the aforementioned prior art in which a plurality of refractive surfaces of a lens have their slopes over certain distances, resulting in a large size, the present invention enables improvement of side illumination effects and fabrication of a lens with a compact size since the lens has double refractive surfaces that are in the form of a straight line and an ellipse. Further, the conventional lens has the refractive surfaces indented toward a central axis, but the lens of the present invention has the refractive surface formed to extend outward from the periphery of the total reflection surface.

Although the most preferred embodiment in which the luminescent chip is encapsulated by the lens has been described in the present invention, a certain space (not shown) may be formed between the luminescent chip and the lens. At this time, a material with a refractive index of 1.2 to 2.0 can be selected as a material filled into the space. For example, the space may be filled with epoxy/silicon resin or air/another gas (e.g. nitrogen), or may be under a vacuum condition. Here, a fluorescent material can be further included in the space.

Moreover, although the lens includes the linear surface and the curved surface extending therefrom, it is not limited thereto but may be modified into various shapes. That is, the lens may include a linear surface extending from a curved surface, and the linear surface may be bent. Next, a side illumination lens with a linear surface extending from a curved surface and bent once, and a luminescent device with the lens according to a third embodiment of the present invention will be described below.

In the following third embodiment, a description thereof overlapping with that of the aforementioned embodiment will be omitted. Further, since a description of a modification of a luminescent device with the lens overlaps with that of the aforementioned embodiment, the description will be omitted.

Embodiment 3

FIG. 33 is a conceptual sectional view of a luminescent device with a lens according to a third embodiment of the present invention, FIG. 34 is a perspective view of the lens according to the third embodiment, FIG. 35 is a conceptual view illustrating the operation of the total internal reflection lens according to the third embodiment, and FIG. 36 is a graph showing simulation results of the luminescent device according to the third embodiment.

Referring to FIGS. 33, 34 and 35, the lens of this embodiment comprises a first total reflection surface 2121 with a V-shaped section and a certain slope with respect to a central axis x; a second total reflection surface 2122 with a slope smaller than that of the first total reflection surface 2121; a curved first refractive surface 2123a extending downward from a periphery of the second total reflection surface 2122; a linear second refractive surface 2123b extending from a periphery of the first refractive surface 2123a in a direction perpendicular to the central axis x; and a linear third refractive surface 2123c extending from a periphery of the second refractive surface 2123b in a direction parallel to the central axis x.

As shown in FIGS. 33 and 34, assuming that the diameter of the entire lens 2120 is 1, the first reflection surface 2121 is formed at a central portion of the lens 2120, and the maximum diameter of the first total reflection surface 2121 is ¹⁄₁₂ to ⅙; and the second reflection surface 2122 is formed to surround the first total reflection surface 2121, and the maximum diameter thereof is ⅐ to ⅓. The first refractive surface 2123a is made in the form of an ellipse surrounding the second total reflection surface 2122, and the maximum diameter thereof is ½ to ⅞; and the maximum diameter of the second and third refractive surfaces 2123b and 2123c is the same as the entire lens 2120. Here, the width of the second refractive surface 2123b is ¹⁄₁₆ to ⅛ of the diameter of the lens.

Further, assuming that the height of the lens 2120 is 1, the height of the first total reflection surface 2121 is ¹⁄₁₂ to ⅙; the height of the second total reflection surface 2123 is ¹⁄₁₂ to ⅙; the height of the first refractive surface 2123a is ¼ to ¾; and the height of the third refractive surface 2123c is ¼ to ¾. Here, the first refractive surface 2123a is made in the form of an ellipse as shown in the figures, and a ratio of minor and major axes of the ellipse is formed in a range of 1:4 or less. That is, it may be a circle.

Accordingly, as shown in FIG. 35, light R4 and R5, which is emitted from a light source (luminescent chip) and is then incident on the first and second total reflection surfaces 2121 and 2122 is totally reflected, and emerges in a y-axis direction through the downward rounded second refractive surface 1123b. Light R3, R2 and R1 incident on the first, second and third refractive surfaces 2123a, 2123b and 2123c is refracted and then emitted in the y-axis direction.

As such, the lens 1120 of the present invention is formed to have total the reflection surfaces with different slopes at the central portion thereof, and the rounded, horizontal and vertical surfaces at an edge thereof, so that a peak value of luminous intensity is located in a range of +10 with respect to +64, as shown in FIG. 36.

In FIG. 36, a lens 2120 with a refractive index of 1.5 was used such that an angle defined by the first total reflection surface 2121 and light emitted from the luminescent chip 2110 became about 50 degrees greater than a critical angle, and an angle defined by the second total reflection surface 2122 and light emitted from the luminescent chip 2110 became about 43 degrees. Then, luminous intensity is simulated in a range of +90 to −90 with respect to a region where the luminescent chip 1110 was located, and the results are shown in the graph.

As shown in the graph of FIG. 36, the luminous intensity is the highest in the vicinity of ±64 degrees. That is, the luminous intensity is about 0.99 at +64 degrees and about 0.98 at −64 degrees. Further, the luminous intensity is not greater than 0.2 within ±40 degrees.

As described above, this is because light totally reflected on the first and second reflection surfaces 2121 and 2122, and light refracted through the first to third refractive surfaces 2123a, 2123b and 2123c travels in the side direction of the luminescent device.

Since a method of fabricating the lens and a luminescent device with the lens are the same as the aforementioned embodiment, descriptions thereof will be omitted.

A side illumination lens with a linear surface bent twice and a curved surface extending therefrom, and a luminescent device with the lens according to a fourth embodiment of the present invention will be described below.

In the following fourth embodiment, a description thereof overlapping with that of the aforementioned embodiment will be omitted. Further, since a description of a modification of a luminescent device with the lens overlaps with that of the aforementioned embodiment, the description will be omitted.

Embodiment 4

FIG. 37 is a conceptual sectional view of a luminescent device with a lens according to a fourth embodiment of the present invention, FIG. 38 is a perspective view of the lens according to the fourth embodiment, FIG. 39 is a conceptual view illustrating the operation of the total internal reflection lens according to the fourth embodiment, and FIG. 40 is a graph showing simulation results of the luminescent device according to the fourth embodiment.

Referring to FIGS. 37, 38 and 39, the lens of this embodiment comprises a first total reflection surface 3121 with a V-shaped section and a certain slope with respect to a central axis x; a second total reflection surface 3122 with a slope smaller than that of the first total reflection surface 3121; a linear first refractive surface 3123a extending from a periphery of the second total reflection surface 3122 in a direction perpendicular to the central axis x; a linear second refractive surface 3123b extending downward in parallel to the central axis x from a periphery of the first refractive surface 3123a; a linear third refractive surface 3123c extending from a periphery of the second refractive surface 3123b in the direction perpendicular to the central axis x; and a curved fourth refractive surface 3123d extending downward from a periphery of the third refractive surface 3123c.

As shown in FIGS. 37 and 38, assuming that the diameter of the entire lens 3120 is 1, the maximum diameter of the first total reflection surface 3121 is ¹⁄₁₂ to ⅙, and the maximum diameter of the second total reflection surface 3122 is ⅐ to ⅓. The maximum diameter of the first refractive surface 3123a is ⅙ to ½, and the width of the first refractive surface 3123a is ¹⁄₃₆ to ¹⁄₂₄ of the diameter of the lens 3120. The maximum diameter of the third refractive surface 3123c is ⅕ to ⅔, and the width of the third refractive surface 3123c is ¹⁄₂₄ to ⅐. The diameter of the fourth refractive surface 3123d is the same as the entire lens 3120.

Further, assuming that the height of the lens 3120 is 1, the height of the first total reflection surface 3121 is ¼ to ¾; the height of the second total reflection surface 3122 is ⅙ to ¼; the height of the second refractive surface 3123b is ¹⁄₁₂ to ⅛; and the height of the fourth refractive surface 3123d is ⅞ to ¹¹⁄₁₂. Here, the fourth refractive surface 3123d is made in the form of an ellipse as shown in the figures, and a ratio of minor and major axes of the ellipse is in a range of 1:4 or less. That is, it may be a circle.

Accordingly, as shown in FIG. 39, light R2 and R6, which is emitted from a light source (luminescent chip) and is then incident on the first and second total reflection surfaces 3121 and 3122, are totally reflected, and emerges in a y-axis direction through the refractive surfaces 3123a, 3123b, 3123c and 3123d. Light R5, R4, R3 and R1 incident on the first to fourth refractive surfaces 3123a, 3123b, 3123c and 3123d are refracted and emerges in the y-axis direction.

As such, the lens 4120 of the present invention is formed to have the total reflection surfaces with different slopes at a central portion thereof, and the rounded surface and the plurality of horizontal and vertical surfaces at an edge thereof, so that a peak value of luminous intensity is in a range of ±10 with respect to ±76 as shown in FIG. 40.

In FIG. 40, a lens 3120 with a refractive index of 1.5 was used such that an angle defined by the first total reflection surface 3121 and light emitted from the luminescent chip 3110 became about 50 degrees greater than a critical angle, and an angle defined by the second total reflection surface 3122 and light emitted from the luminescent chip 3110 became about 43 degrees. Then, luminous intensity is simulated in a range of +90 to −90 with respect to a region where the luminescent chip is located, and the results are shown in the graph.

As shown in the graph of FIG. 40, the luminous intensity is the highest in the vicinity of ±76 degrees. That is, the luminous intensity is about 0.98 at +76 degrees and about 0.97 at −77 degrees. Further, the luminous intensity is not greater than 0.2 within ±40 degrees.

Since a method of fabricating the lens and a luminescent device with the lens are the same as the aforementioned embodiment, descriptions thereof will be omitted.

A side illumination lens with a linear surface bent once and a curved surface extending therefrom, and a luminescent device with the lens according to a fifth embodiment of the present invention will be described below.

In the following fifth embodiment, a description thereof overlapping with that of the aforementioned embodiment will be omitted. Further, since a description of a modification of a luminescent device with the lens overlaps with that of the aforementioned embodiment, the description will be omitted.

Embodiment 5

FIG. 41 is a conceptual sectional view of a luminescent device with a lens according to a fifth embodiment of the present invention, FIG. 42 is a perspective view of the lens according to the fifth embodiment, FIG. 43 is a conceptual view illustrating the operation of the total internal reflection lens according to the fifth embodiment, and FIG. 44 is a graph showing simulation results of the luminescent device according to the fifth embodiment.

Referring to FIGS. 41, 42 and 43, the lens of this embodiment comprises a first total reflection surface 4121 with a V-shaped section and a certain slope with respect to a central axis x; a second total reflection surface 4122 with a slope smaller than that of the first total reflection surface 4121; a linear first refractive surface 4123a extending downward from a periphery of the second total reflection surface 4122 in a direction parallel to the central axis x; a linear second refractive surface 4123b extending from a periphery of the first refractive surface 4123a in the direction perpendicular to the central axis x; and a curved third refractive surface 4123c extending downward from a periphery of the second refractive surface 4123b.

As shown in FIGS. 41 and 42, assuming that the diameter of the entire lens 4120 is 1, the maximum diameter of the first total reflection surface 4121 is 1/12 to 1/6, and the maximum diameter of the second total reflection surface 4122 is 1/7 to 1/3. The maximum diameter of the second refractive surface 4123b is 1/6 to 2/3, and the width of the second refractive surface 4123b is 1/12 to 1/6 of the diameter of the lens 4120. The diameter of the third refractive surface 4123c is the same as the entire lens.

Further, assuming that the height of the lens 4120 is 1, the height of the first total reflection surface 4121 is 1/4 to 3/4; the height of the second total reflection surface 4122 is 1/6 to 1/4; the height of the first refractive surface 4123a is 1/12 to 1/8; and the height of the third refractive surface 4123c is 7/8 to 11/12. Here, the third refractive surface 4123c is made in the form of an ellipse as shown in the figures, and a ratio of minor and major axes of the ellipse is in a range of 1:4 or less. That is, it may be a circle.

Accordingly, as shown in FIG. 43, light R2 and R4, which is emitted from a light source (luminescent chip) and is then incident on the first and second total reflection surfaces 4121 and 4122, are totally reflected, and emerges in a y-axis direction through the refractive surfaces 4123a, 4123b and 4123c. Light R5, R3 and R1 incident on the first to third refractive surfaces 4123a, 4123b and 4123c are refracted and emerges in the y-axis direction.

As such, the lens 4120 of the present invention is formed to have the total reflection surfaces with different slopes at a central portion thereof, and the rounded surface and the plurality of horizontal and vertical surfaces at an edge thereof, so that a peak value of luminous intensity is in a range of ±10 with respect to ±70 as shown in FIG. 44.

In FIG. 44, a lens 4120 with a refractive index of 1.5 was used such that an angle defined by the first total reflection surface 4121 and light emitted from the luminescent chip 4110 became about 50 degrees greater than a critical angle, and an angle defined by the second total reflection surface 4122 and light emitted from the luminescent chip 4110 became about 43 degrees. Then, luminous intensity is simulated in a range of +90 to −90 with respect to a region where the luminescent chip is located, and the results are shown in the graph.

As shown in the graph of FIG. 44, the luminous intensity is the highest in the vicinity of ±70 degrees. That is, the luminous intensity is about 1.0 at +70 degrees and about 0.97 at −70 degrees. Further, the luminous intensity is not greater than 0.2 within ±40 degrees.

What is claimed is:

1. A light emitting device, comprising:
   a light emitting diode;
   a lens arranged to receive light from the light emitting diode, the lens comprising a total reflection surface having a total reflection slope with respect to a central axis of the light emitting diode; and
   at least one of a linear refractive surface and a curved refractive surface formed to extend away from the central axis and beyond a periphery of the total reflection surface.

2. The light emitting device as claimed in claim 1, wherein the refractive surface comprises:
   a linear refractive surface formed by being bent at the periphery of the total reflection surface; and
   a curved refractive surface formed to extend from a periphery of the linear refractive surface.

3. The light emitting device as claimed in claim 1, wherein the refractive surface comprises:
   a curved refractive surface formed to extend from the periphery of the total reflection surface; and
   a linear refractive surface formed by being bent at a periphery of the curved refractive surface.

4. The light emitting device as claimed in claim 1, wherein the curved refractive surface takes the shape of an ellipse, and a ratio of minor and major axes of the ellipse is 1:4 or less.

5. The light emitting device as claimed in claim 1, wherein the linear refractive surface is bent more than once.

6. The light emitting device as claimed in claim 1, wherein the total reflection surface comprises:
   a first total reflection surface having a section in the form of a V-shaped recess with a predetermined slope; and
   a second total reflection surface extending upward from a periphery of the first total reflection surface and formed to be sloped with a gradient smaller than that of the first total reflection surface.

7. The light emitting device as claimed in claim 1, wherein the refractive index of the body is 1.2 to 2.0.

8. The light emitting device as claimed in claim 2, wherein the curved refractive surface takes the shape of an ellipse, and a ratio of minor and major axes of the ellipse is 1:4 or less.

9. The light emitting device as claimed in claim 3, wherein the curved refractive surface takes the shape of an ellipse, and a ratio of minor and major axes of the ellipse is 1:4 or less.

10. The light emitting device as claimed in claim 2, wherein the linear refractive surface is bent more than once.

11. The light emitting device as claimed in claim 3, wherein the linear refractive surface is bent more than once.

* * * * *